(12) United States Patent
Chuko et al.

(10) Patent No.: US 11,614,574 B2
(45) Date of Patent: Mar. 28, 2023

(54) COLORING COMPOSITION FOR SOLID-STATE IMAGING ELEMENT

(71) Applicant: TOPPAN PRINTING CO., LTD., Tokyo (JP)

(72) Inventors: Tomotaka Chuko, Tokyo (JP); Kenji Hiki, Tokyo (JP); Ryuji Doi, Tokyo (JP); Kazushige Kitazawa, Tokyo (JP); Shinichi Okamoto, Tokyo (JP); Tetsuya Hirota, Tokyo (JP); Tadatoshi Maeda, Tokyo (JP); Hiroyuki Chinone, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 16/581,783

(22) Filed: Sep. 25, 2019

(65) Prior Publication Data
US 2020/0018878 A1 Jan. 16, 2020

Related U.S. Application Data

(63) Continuation of application No. PCT/JP2018/013150, filed on Mar. 29, 2018.

(30) Foreign Application Priority Data

Mar. 29, 2017 (JP) .................. 2017-065341
Oct. 6, 2017 (JP) .................. 2017-195892

(51) Int. Cl.
| G02B 5/22 | (2006.01) |
| H01L 27/146 | (2006.01) |
| C09D 7/63 | (2018.01) |
| C09D 7/41 | (2018.01) |
| C09D 4/06 | (2006.01) |
| C09D 5/32 | (2006.01) |
| C09D 133/14 | (2006.01) |

(52) U.S. Cl.
CPC .............. *G02B 5/223* (2013.01); *C09D 4/06* (2013.01); *C09D 5/32* (2013.01); *C09D 7/41* (2018.01); *C09D 7/63* (2018.01); *C09D 133/14* (2013.01); *H01L 27/14621* (2013.01)

(58) Field of Classification Search
CPC . G02B 5/223; C09D 4/06; C09D 5/32; C09D 7/41; C09D 7/63; C09D 133/14; H01L 27/14621
See application file for complete search history.

(56) References Cited

U.S. PATENT DOCUMENTS

| 10,386,721 | B2 | 8/2019 | Murai et al. | |
| 2010/0044817 | A1* | 2/2010 | Takakuwa | C08L 51/08 |
| | | | | 257/432 |
| 2011/0008589 | A1* | 1/2011 | Kimura | C08G 77/045 |
| | | | | 428/195.1 |
| 2011/0045412 | A1 | 2/2011 | Kaneko et al. | |
| 2011/0155973 | A1 | 6/2011 | Lenz et al. | |
| 2012/0236426 | A1 | 9/2012 | Makino | |
| 2013/0081858 | A1* | 4/2013 | Norikoshi | G03F 7/0047 |
| | | | | 174/250 |
| 2013/0306919 | A1* | 11/2013 | Maruyama | G02B 5/23 |
| | | | | 252/586 |
| 2014/0374143 | A1* | 12/2014 | Okamoto | G03F 7/032 |
| | | | | 174/250 |
| 2015/0240071 | A1* | 8/2015 | Okamoto | C08L 63/00 |
| | | | | 428/195.1 |
| 2016/0139505 | A1* | 5/2016 | Taguchi | G02B 5/201 |
| | | | | 430/7 |
| 2018/0039179 | A1 | 2/2018 | Murai et al. | |
| 2018/0217312 | A1* | 8/2018 | Hiraoka | C08K 5/37 |

FOREIGN PATENT DOCUMENTS

| CN | 102236257 | 11/2011 |
| CN | 102385246 | 3/2012 |
| CN | 105278246 | 1/2016 |
| CN | 105425541 | 3/2016 |
| EP | 1944339 | 7/2008 |
| JP | S5715620 | 3/1982 |
| JP | S5940172 | 9/1984 |
| JP | S6317102 | 4/1988 |
| JP | S63305173 | 12/1988 |
| JP | H059469 | 2/1993 |
| JP | 2000214592 | 8/2000 |
| JP | 2001335717 | 12/2001 |
| JP | 2003128669 | 5/2003 |
| JP | 2004091497 | 3/2004 |
| JP | 2004333817 | 11/2004 |
| JP | 2006104243 | 4/2006 |
| JP | 2006267792 | 10/2006 |

(Continued)

OTHER PUBLICATIONS

"International Search Report (Form PCT/ISA/210) of PCT/JP2018/013150," dated Jun. 26, 2018, with English translation thereof, pp. 1-4.
"Notice of Reasons for Refusal, Japanese patent application No. 2017-195892", drafting on Nov. 30, 2017, with English translation thereof, p. 1-p. 10.
"International Preliminary report on patentability (Form PCT/IB/338, Form PCT/IB/373) of PCT/JP2018/013150", dated Oct. 1, 2019, with English translation of written opinion (Form PCT/ISA/237), pp. 1-12.
"Search Report of Europe Counterpart Application", dated Oct. 29, 2020, p. 1-p. 7.

(Continued)

*Primary Examiner* — Bijan Ahvazi
(74) *Attorney, Agent, or Firm* — JCIPRNET

(57) ABSTRACT

A photosensitive green composition for a color filter of a solid-state imaging element, contains a colorant (A), a binder resin (B), a photopolymerization initiator (C), a photopolymerizable monomer (D), an ultraviolet absorber (E), and a monofunctional thiol (F), wherein the colorant (A) contains C.I. Pigment Green 36 and/or C.I. Pigment Green 58.

12 Claims, No Drawings

(56) References Cited

FOREIGN PATENT DOCUMENTS

| | | | | |
|---|---|---|---|---|
| JP | 2007156395 | 6/2007 | | |
| JP | 2008040404 | 2/2008 | | |
| JP | 2008094873 | 4/2008 | | |
| JP | 2008094986 | 4/2008 | | |
| JP | 2008095007 | 4/2008 | | |
| JP | 2008195916 | 8/2008 | | |
| JP | 2010132804 | 6/2010 | | |
| JP | 4585781 | 11/2010 | | |
| JP | 2011137125 | 7/2011 | | |
| JP | 2011158655 | 8/2011 | | |
| JP | 2011523433 | 8/2011 | | |
| JP | 2011253174 | 12/2011 | | |
| JP | 2011253174 A | * 12/2011 | | C09B 67/20 |
| JP | 4893859 | 3/2012 | | |
| JP | 2012053278 | 3/2012 | | |
| JP | 5010780 | 8/2012 | | |
| JP | 2012181505 | 9/2012 | | |
| JP | 2012229344 | 11/2012 | | |
| JP | 5214001 | 6/2013 | | |
| JP | 2016047898 | 4/2016 | | |
| JP | 2016204585 A | * 12/2016 | | C08F 2/50 |
| JP | 2017003884 | 1/2017 | | |
| KR | 20120092023 | 8/2012 | | |
| KR | 20120129868 | 11/2012 | | |
| KR | 20130032243 | 4/2013 | | |
| TW | 201041982 | 12/2010 | | |
| TW | 201135365 | 10/2011 | | |
| TW | 201300945 | 1/2013 | | |
| TW | 201337456 | 9/2013 | | |
| WO | 2010146801 | 12/2010 | | |
| WO | 2012127964 | 9/2012 | | |
| WO | 2016136752 | 9/2016 | | |

OTHER PUBLICATIONS

"Office Action of Taiwan Counterpart Application" with English translation thereof, dated Jun. 23, 2021, p. 1-p. 14.

"Office Action of China Counterpart Application", dated Mar. 11, 2021, with English translation thereof, p. 1-p. 20.

"Office Action of Taiwan Counterpart Application" with English translation thereof, dated Jan. 4, 2022, p. 1-p. 8.

"Office Action of Korea Counterpart Application" with English translation thereof, dated Aug. 19, 2022, p. 1-p. 14.

* cited by examiner

COLORING COMPOSITION FOR SOLID-STATE IMAGING ELEMENT

CROSS-REFERENCE TO RELATED APPLICATION

This application is a Continuation Application of PCT Application No. PCT/JP2018/013150, filed Mar. 29, 2018 based upon and claiming the benefit of priority from prior Japanese Patent Application Nos. 2017-065341, filed Mar. 29, 2017 and 2017-195892, filed Oct. 6, 2017, the entire contents of all of which are incorporated herein by reference.

BACKGROUND

1. Field

The present invention relates to a color filter for a solid-state imaging element mounted on a solid-state imaging element represented by a complementary metal oxide semiconductor (C-MOS) image sensor, a charge coupled device (CCD) image sensor, or the like, a solid-state imaging element including the color filter, and a photosensitive coloring composition for a solid-state imaging element.

2. Description of the Related Art

Solid-state imaging elements such as C-MOS image sensors and CCD image sensors separate colors generally by using color filters, specifically, by arranging filter segments of B (blue), G (green), and R (red), which are primary colors of additive mixing, on light-receiving elements. Recently, along with the reduction in pixel size, performance requirements for color separation on this solid-state imaging apparatus are becoming severe. Therefore, in order to maintain device characteristics such as color shading characteristics and color mixing prevention, color filter is required to have a smaller film thickness, rectangular shape, and no overlapped region where colors are overlapped between organic pixels.

Specifically, in color filters for solid-state imaging elements, there is a tendency to reduce the thickness the organic patterns to, for example, 1 μm or less, and miniaturize the pixel pattern to have a size of 2 μm or less, for example, 0.5 to 2.0 μm. With such a tendency, there has arisen a problem that poor pattern shape of a color filter formed by photolithography process and residues thereon adversely affect characteristics of the solid-state imaging element. In order to solve this problem, a monofunctional thiol has been used (Patent Document 4).

Patent Document 1: Jpn. Pat. Appln. KOKAI Publication No. 2006-267792
Patent Document 2: Jpn. Pat. Appln. KOKAI Publication No. 2008-040404
Patent Document 3: Jpn. Pat. Appln. KOKAI Publication No. 2006-104243
Patent Document 4: Japanese Patent No. 5214001

SUMMARY

The above-described method has a problem that peel-off development occurs in which a coating film is peeled off from a base material during development, and as a result, chipping of the pattern occurs.

It is an object of the present invention to provide a photosensitive green composition for a color filter of a solid-state imaging element that can form a pixel having a cross-sectional shape excellent in verticality, an excellent adhesion property and little residue without pattern chipping due to peel-off development, and a color filter for a solid-state imaging element and a solid-state imaging element using the same.

The present inventors have conducted intensive studies to solve the above problems, and consequently found that the above problems are solved by a photosensitive green composition for a color filter of a solid-state imaging element comprising a colorant (A), a binder resin (B), a photopolymerization initiator (C), a photopolymerizable monomer (D), an ultraviolet absorber (E), and a monofunctional thiol (F), wherein the colorant (A) comprises C.I. Pigment Green 36 and/or C.I. Pigment Green 58, thereby achieving the present invention.

That is, the present invention relates to a photosensitive green composition for a color filter of a solid-state imaging element, comprising:
a colorant (A);
a binder resin (B);
a photopolymerization initiator (C);
a photopolymerizable monomer (D);
an ultraviolet absorber (E); and
a monofunctional thiol (F),
wherein the colorant (A) comprises C.I. Pigment Green 36 and/or C.I. Pigment Green 58.

The present invention also relates to the photosensitive green composition for a color filter of a solid-state imaging element, wherein the photopolymerizable monomer (D) comprises urethane acrylate and/or penta- or higher functional acrylate excluding urethane acrylate.

The present invention also relates to the photosensitive green composition for a color filter of a solid-state imaging element, wherein a content of the photopolymerizable monomer (D) is 15 to 30% by weight in a total solid content of the photosensitive green coloring composition, and a total content of the urethane acrylate and the penta- or higher functional acrylate excluding urethane acrylate is 50 to 90% by weight in a total solid content of the photopolymerizable monomer (D).

The present invention also relates to the photosensitive green composition for a color filter of a solid-state imaging element, wherein the urethane acrylate is a compound obtained by reacting a compound represented by a general formula (1) with a polyfunctional isocyanate represented by a general formula (2), the general formula (1) being

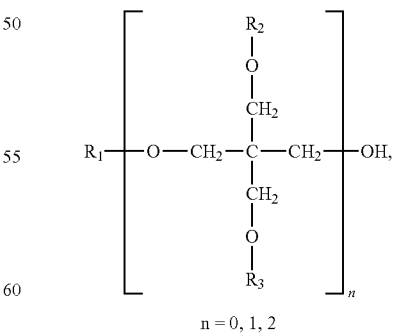

n = 0, 1, 2 wherein $R_1$, $R_2$, $R_3$ independently represent an acryloyl group or a methacryloyl group, and
the general formula (2) being

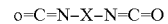

wherein X represents a divalent alkylene group or an arylene group.

The present invention also relates to the photosensitive green composition for a color filter of a solid-state imaging element, wherein a content of the ultraviolet absorber (E) is 0.05 to 3.00% by weight in a total solid content of the photosensitive green coloring composition.

The present invention also relates to the photosensitive green composition for a color filter of a solid-state imaging element, wherein the ultraviolet absorber (E) comprises an ultraviolet absorber having an absorbance at a wavelength of 365 nm of 0.4 or more measured when dissolved in chloroform to be diluted to 10 mg/L.

The present invention also relates to the photosensitive green composition for a color filter of a solid-state imaging element, wherein the ultraviolet absorber (E) comprises at least one selected from benzotriazole-based compounds, benzophenone-based compounds, and triazine-based compounds.

The present invention also relates to the photosensitive green composition for a color filter of a solid-state imaging element, wherein a content of the monofunctional thiol (F) is 0.05 to 3.00% by weight in a total solid content of the photosensitive green composition.

The present invention also relates to the photosensitive green composition for a color filter of a solid-state imaging element, wherein the monofunctional thiol (F) is represented by the following general formula (3), the general formula (3) being

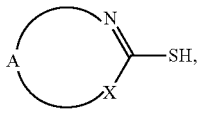

wherein X represents a sulfur atom, an oxygen atom, or >N—R, R represents a hydrogen atom, an alkyl group, or an aryl group, and A represents an atomic group forming a heterocycle together with N=C—X.

The present invention also relates to the photosensitive green composition for a color filter of a solid-state imaging element, wherein the monofunctional thiol (F) is represented by the following general formula (4), the general formula (4) being

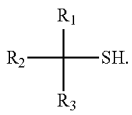

wherein $R_1$ to $R_3$ each independently represent an alkyl group which may have a substituent, an aryl group which may have a substituent, a cycloalkyl group which may have a substituent, a heterocyclic group which may have a substituent, an alkoxyl group which may have a substituent, an aryloxy group which may have a substituent, an alkylthio group which may have a substituent, or an arylthio group which may have a substituent.

The present invention also relates to the photosensitive green composition for a color filter of a solid-state imaging element, wherein a content of the colorant (A) is 40 to 70% by weight in a total solid content of the photosensitive green composition.

The present invention also relates to the photosensitive green composition for a color filter of a solid-state imaging element, wherein a content of the photopolymerization initiator (C) is 0.3 to 5.0% by weight in a total solid content of the photosensitive green composition.

The present invention also relates to the photosensitive green composition for a color filter of a solid-state imaging element, wherein the photopolymerization initiator (C) comprises an oxime ester-based photopolymerization initiator.

The present invention also relates to a color filter for a solid-state imaging element, comprising a filter segment made from the photosensitive green composition for a color filter of a solid-state imaging element on a base material.

The present invention also relates to a solid-state imaging element comprising the color filter for a solid-state imaging element.

The photosensitive green composition of the present invention can form a pixel pattern having a cross-sectional shape excellent in verticality, an excellent adhesion property and little residue without pattern chipping due to peel-off development.

DETAILED DESCRIPTION

The photosensitive coloring composition of the present invention is a photosensitive green composition containing a colorant (A), a binder resin (B), a photopolymerization initiator (C), a photopolymerizable monomer (D), an ultraviolet absorber (E), and a monofunctional thiol (F), wherein the colorant (A) contains C.I. Pigment Green 36 and/or C.I. Pigment Green 58. Since the above-mentioned photosensitive green composition is excellent in ultraviolet curability, it is possible to form a pixel pattern suitable for a solid-state imaging element.

Hereinafter, the present invention will be described in detail. In the present specification, when described as "(meth)acryloyl", "(meth)acryl", "(meth)acrylic acid", "(meth)acrylate", or "(meth)acrylamide", unless otherwise specified, they represent "acryloyl and/or methacryloyl", "acryl and/or methacryl", "acrylic acid and/or methacrylic acid", "acrylate and/or methacrylate", or "acrylamide and/or methacrylamide", respectively.

In addition, "C.I." referred in the present specification means color index (C.I.).

<Coloring Composition>

The photosensitive coloring composition of the present invention contains a colorant (A), a binder resin (B), a photopolymerization initiator (C), a photopolymerizable monomer (D), an ultraviolet absorber (E), and a monofunctional thiol (F), wherein the colorant (A) contains C.I. Pigment Green 36 and/or C.I. Pigment Green 58.

<Colorant (A)>

The present invention relates to a photosensitive green composition for a color filter of a solid-state imaging element, and is characterized in that the colorant (A) used therein contains C.I. Pigment Green 36 and/or C.I. Pigment Green 58. C.I. Pigment Green 36 and C.I. Pigment Green 58 have an effect that they achieve excellent transmittance.

Examples of colorants that can be used in combination with C.I. Pigment Green 36 and C.I. Pigment Green 58 include the following, but are not limited thereto.

Examples of green pigments can include C.I. Pigment Green 1, 2, 4, 7, 8, 10, 13, 14, 15, 17, 18, 19, 26, 45, 48, 50, 51, 54, 55, 59, 62, and 63.

The coloring composition of the present invention may contain a yellow colorant for the purpose of adjusting hue as long as the effects of the present invention are not impaired.

As a yellow colorant which can be used for the coloring composition of the present invention, C.I. Pigment Yellow 1, 2, 3, 4, 5, 6, 10, 12, 13, 14, 15, 16, 17, 18, 24, 31, 32, 34, 35, 35:1, 36, 36:1, 37, 37:1, 40, 42, 43, 53, 55, 60, 61, 62, 63, 65, 73, 74, 77, 81, 83, 93, 94, 95, 97, 98, 100, 101, 104, 106, 108, 109, 110, 113, 114, 115, 116, 117, 118, 119, 120, 123, 126, 127, 128, 129, 138, 139, 147, 150, 151, 152, 153, 154, 155, 156, 161, 162, 164, 166, 167, 168, 169, 170, 171, 172, 173, 174, 175, 176 177, 179, 180, 181, 182, 185, 187, 188, 192, 193, 194, 196, 198, 199, 213, 214, or the like can be used. Among them, from the viewpoint of heat resistance, light resistance, and transmittance of a filter segment, preferred are C.I. Pigment Yellow 138, 139, 150, and 185, and quinophthalone compounds represented by the following general formula (5).

General formula (5)

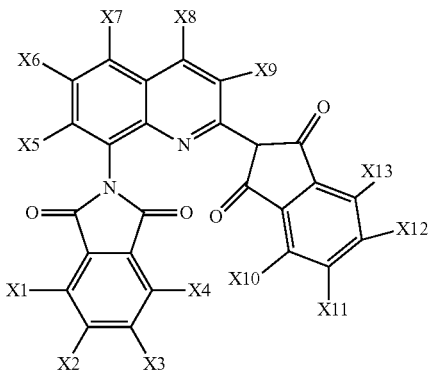

In the general formula (5), X1 to X13 each independently represents a hydrogen atom, a halogen atom, an alkyl group which may have a substituent, an alkoxyl group which may have a substituent, an aryl group which may have a substituent, —SO$_3$H group, —COOH group, a metal salt of —SO$_3$H group or —COOH group, an alkyl ammonium salt of —SO$_3$H group or —COOH group, a phthalimidomethyl group which may have a substituent, or a sulfamoyl group which may have a substituent, and the adjacent groups of X1 to X4 and/or X10 to X13 together form an aromatic ring which may have a substituent.

Examples of the halogen atom include fluorine, chlorine, bromine, and iodine.

Examples of the alkyl group which may have a substituent include, in addition to linear or branched alkyl groups such as methyl group, ethyl group, propyl group, isopropyl group, butyl group, isobutyl group, tert-butyl group, neopentyl group, n-hexyl group, n-octyl group, stearyl group, and 2-ethylhexyl group, alkyl groups having substituents such as trichloromethyl group, trifluoromethyl group, 2,2,2-trifluoroethyl group, 2,2-dibromoethyl group, 2,2,3,3-tetrafluoropropyl group, 2-ethoxyethyl group, 2-butoxyethyl group, 2-nitropropyl group, benzyl group, 4-methylbenzyl group, 4-tert-butylbenzyl group, 4-methoxybenzyl group, 4-nitrobenzyl group, and 2,4-dichlorobenzyl group.

Examples of the alkoxyl group which may have a substituent include, in addition to linear or branched alkoxyl groups such as methoxy group, ethoxy group, propoxy group, isopropoxy group, n-butoxy group, isobutyloxy group, tert-butyloxy group, neopentyloxy group, 2,3-dimethyl-3-pentoxy group, n-hexyloxy group, n-octyloxy group, stearyloxy group, and 2-ethylhexyloxy group, alkoxyl groups having substituents such as trichloromethoxy group, trifluoromethoxy group, 2,2,2-trifluoroethoxy group, 2,2,3,3-tetrafluoropropyloxy group, 2,2-ditrifluoromethylpropoxy group, 2-ethoxyethoxy group, 2-butoxyethoxy group, 2-nitropropoxy group, and benzyloxy group.

Examples of the aryl group which may have a substituent include, in addition to aryl groups such as phenyl group, naphthyl group, and anthranyl group, aryl groups having substituents such as p-methylphenyl group, p-bromophenyl group, p-nitrophenyl group, p-methoxyphenyl group, 2,4-dichlorophenyl group, pentafluorophenyl group, 2-aminophenyl group, 2-methyl-4-chlorophenyl group, 4-hydroxy-1-naphthyl group, 6-methyl-2-naphthyl group, 4,5,8-trichloro-2-naphthyl group, anthraquinonyl group, and 2-aminoanthraquinonyl group.

Examples of the acid group include —SO$_3$H and —COOH, and examples of monovalent to trivalent metal salt of these acidic groups include sodium salts, potassium salts, magnesium salts, calcium salts, iron salts, aluminum salts, and the like. Examples of the alkyl ammonium salt of the acidic group include ammonium salts of long-chain monoalkyl amines such as octylamine, laurylamine, and stearylamine, and quaternary alkylammonium salts such as palmityltrimethylammonium, dilauryldimethylammonium, and distearyldimethylammonium salts.

Examples of the "substituent" in the phthalimidomethyl group ($C_6H_4(CO)_2N$—$CH_2$—) which may have a substituent, and the sulfamoyl group ($H_2NSO_2$—) which may have a substituent include the above-mentioned halogen atoms, alkyl groups which may have a substituent, alkoxyl groups which may have a substituent, aryl groups which may have a substituent, and the like.

The adjacent groups X1 to X4 and/or X10 to X13 in the general formula (5) together form an aromatic ring which may have a substituent. Examples of the aromatic ring herein include hydrocarbon aromatic rings and heteroaromatic rings, and examples of the hydrocarbon aromatic ring include benzene ring, naphthalene ring, anthracene ring, phenanthrene ring, and the like, and examples of the heteroaromatic ring include pyridine ring, pyrazine ring, pyrrole ring, quinoline ring, quinoxaline ring, furan ring, benzofuran ring, thiophene ring, benzothiophene ring, oxazole ring, thiazole ring, imidazole ring, pyrazole ring, indole ring, carbazole ring, and the like.

<Concentration of Coloring Composition>

Since a thin film of 1.0 µm or less is required for a color imaging element, the pigment concentration in the solid content of the colorant of the present invention is preferably 40% by weight or more.

<Binder Resin (B)>

Examples of the binder resin contained in the coloring composition of the present invention include conventionally known thermoplastic resins and thermosetting resins.

Examples of the thermoplastic resin include acrylic resins, butyral resins, styrene-maleic acid copolymers, chlorinated polyethylene, chlorinated polypropylene, polyvinyl chloride, vinyl chloride-vinyl acetate copolymers, polyvinyl acetate, polyurethane resins, polyester resins, vinyl-based resins, alkyd resins, polystyrene resins, polyamide resins, rubber-based resins, cyclized rubber-based resins, celluloses, polyethylene (HDPE, LDPE), polybutadiene, polyimide resins, and the like.

When used as the coloring composition, it is preferably a resin having a spectral transmittance of preferably 80% or more and more preferably 95% or more in an entire wavelength region of 400 to 700 nm in a visible light region. When used in the form of an alkali-developable colored resist, it is preferable to use an alkali-soluble vinyl-based resin obtained by copolymerizing acidic group-containing ethylenically unsaturated monomers. In order to further improve photosensitivity, an energy ray curable resin having an ethylenically unsaturated active double bond can also be used.

Examples of the alkali-soluble resin obtained by copolymerizing acidic group-containing ethylenically unsaturated monomers include resins having acidic groups such as carboxyl group or sulfone group. Specific examples of the alkali-soluble resin include an acrylic resin having an acidic group, an α-olefin/maleic acid (anhydride) copolymer, a styrene/styrene sulfonic acid copolymer, an ethylene/(meth)acrylic acid copolymer, an isobutylene/maleic acid (anhydride) copolymer, and the like. Among them, at least one resin selected from an acrylic resin having an acidic group and a styrene/styrene sulfonic acid copolymer, in particular, an acrylic resin having an acidic group, is preferably used because it has high heat resistance and transparency.

As an energy ray curable resin having an ethylenically unsaturated active double bond, a resin prepared by allowing a polymer having a reactive substituent such as hydroxyl group, carboxyl group or amino group to react with a (meth)acrylic acid having a reactive substituent such as isocyanate group, aldehyde group or epoxy group, or with cinnamic acid to introduce photocrosslinkable groups such as (meth)acryloyl group or styryl group into the polymer is used. Alternatively, a resin obtained by allowing a polymer containing an acid anhydride such as a styrene-maleic anhydride copolymer or an α-olefin-maleic anhydride copolymer to be half-esterified with a (meth)acrylic compound having a hydroxyl group such as hyrdoxyalkyl(meth)acrylate is also used.

As the thermoplastic resin, one having alkali soluble performance and energy-ray-hardening performance together is also preferable for the coloring composition.

Examples of monomers constituting the thermoplastic resin include the following. Examples include (meth)acrylates such as methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, 2-ethylhexyl (meth)acrylate, cyclohexyl (meth)acrylate, stearyl (meth) acrylate, lauryl (meth) acrylate, tetrahydrofurfuryl (meth)acrylate, isobornyl (meth)acrylate, phenyl (meth)acrylate, benzyl (meth) acrylate, phenoxyethyl (meth) acrylate, phenoxydiethylene glycol (meth) acrylate, methoxypolypropylene glycol (meth)acrylate, or ethoxypolyethylene glycol (meth)acrylate; (meth)acrylamides such as (meth)acrylamide, N,N-dimethyl (meth)acrylamide, N,N-diethyl (meth)acrylamide, N-isopropyl (meth)acrylamide, diacetone (meth)acrylamide, or acryloyl morpholine; styrenes such as styrene or α-methylstyrene; vinyl ethers such as ethyl vinyl ethers, n-propyl vinyl ethers, isopropyl vinyl ethers, n-butyl vinyl ethers, or isobutyl vinyl ethers; and fatty acid vinyls such as vinyl acetate or vinyl propionate.

Alternatively, examples include N-substituted maleimides such as cyclohexylmaleimide, phenylmaleimide, methylmaleimide, ethylmaleimide, 1,2-bismaleimidoethane, 1,6-bismaleimidohexane, 3-maleimidopropionic acid, 6,7-methylenedioxy-4-methyl-3-maleimide-coumarin, 4,4'-bismaleimidodiphenylmethane, bis(3-ethyl-5-methyl-4-maleimidophenyl)methane, N,N'-1,3-phenylenedimaleimide, N,N'-1,4-phenylenedimaleimide, N-(1-pyrenyl)maleimide, N-(2,4,6-trichlorophenyl)maleimide, N-(4-aminophenyl)maleimide, N-(4-nitrophenyl)maleimide, N-benzylmaleimide, N-bromomethyl-2,3-dichloromaleimide, N-succinimidyl-3-maleimidobenzoate, N-succinimidyl-3-maleimidopropionate, N-succinimidyl-4-maleimidobutyrate, N-succinimidyl-6-maleimidohexanoate, N-[4-(2-benzimidazolyl)phenyl]maleimide, and 9-maleimidoacridine.

In particular, it is preferable to have a structural unit derived from N-substituted maleimide, and among them, from the viewpoint of heat resistance, cyclohexylmaleimide, methylmaleimide, ethylmaleimide, and 1,2-bismaleimidoethane are preferable, and cyclohexylmaleimide is particularly preferable.

Examples of the thermosetting resin include epoxy resins, benzoguanamine resins, rosin modified maleic resins, rosin modified fumaric resins, melamine resins, urea resins, and phenol resins.

The coloring composition of the present invention preferably further contains a thermosetting resin in terms of heat resistance. For example, among them, an epoxy resin and a melamine resin can be more suitably used, in particular, a melamine resin is more preferred, and among them, a melamine compound having a methylol/imino group or a condensate thereof is further preferred.

The thermosetting resin is preferably added in the range of 5 to 60 parts by weight with respect to 100 parts by weight of the colorant. When it is less than 10 parts by weight, the effect of improving heat resistance and light resistance will be reduced, and when it exceeds 60 parts by weight, it is not preferable due to deterioration in developability at the time of alkali development.

The weight average molecular weight (Mw) of the binder resin is preferably in the range of 5,000 to 100,000, and more preferably in the range of 8,000 to 50,000, in order to preferably disperse the colorant. Also, the number average molecular weight (Mn) is preferably in the range of 2,500 to 50,000, and the value of Mw/Mn is preferably 10 or less.

Here, the weight average molecular weight (Mw) and number average molecular weight (Mn) are polystyrene equivalent molecular weight measured by connecting four separation columns in series in gel permeation chromatography "HLC-8120GPC" manufactured by Tosoh Corporation, using "TSK-GEL SUPER H5000", "H4000", "H3000", and "H2000" produced by Tosoh Corporation in this order as fillers, and using tetrahydrofuran as a mobile phase.

When a binder resin is used as a coloring composition, from the viewpoint of pigment dispersibility, developability, and heat resistance, a balance between carboxyl group acting as a pigment adsorptive group and an alkali-soluble group during development, and aliphatic and aromatic groups acting as a group with an affinity for a pigment carrier and a solvent is important for pigment dispersibility, developability, and further, durability, and it is preferable to use a resin having an acid value of 20 to 300 mg KOH/g. When the acid value is less than 20 mg KOH/g, solubility in a developer is poor, and it is difficult to form a fine pattern. When it exceeds 300 mg KOH/g, no fine pattern will remain.

The binder resin can be used in an amount of 20 to 500% by weight, based on the total weight of the colorant. When the amount is less than 30% by weight, film forming property and various resistances become insufficient, and when the amount is more than 500% by weight, the pigment concentration is low and color characteristics cannot be exhibited.

<Photopolymerization Initiator (C)>

The coloring composition of the present invention can be prepared in the form of a solvent-developable or alkali-developable colored resist material by adding a photopolymerization initiator and the like when the composition is cured by ultraviolet irradiation and a filter segment is formed by photolithography method. The blending amount when using the photopolymerization initiator is preferably 0.3 to 5.0% by weight in a total solid content of the photosensitive coloring composition, from the viewpoint of practical ultraviolet sensitivity.

As the photopolymerization initiator, an acetophenone compound such as 4-phenoxydichloroacetophenone, 4-t-butyl-dichloroacetophenone, diethoxyacetophenone, 1-(4-isopropylphenyl)-2-hydroxy-2-methylpropan-1-one, 1-hydroxychlorohexylphenyl ketone, 2-methyl-1-[4-(methylthio)phenyl]-2-morpholinopropan-1-one, 2-(dimethylamino)-2-[(4-methylphenyl)methyl]-1-[4-(4-morpholinyl)phenyl]-1-butanone or 2-benzyl-2-dimethylamino-1-(4-morpholinophenyl)-butan-1-one; a benzoin compound such as benzoin, benzoin methyl ether, benzoin ethyl ether, benzoin isopropyl ether, or benzyldimethyl ketal; a benzophenone compound such as benzophenone, benzoylbenzoic acid, methyl benzoylbenzoate, 4-phenylbenzophenone, hydroxybenzophenone, acrylated benzophenone, 4-benzoyl-4'-methyldiphenyl sulfide, or 3,3'4,4'-tetra (t-butylperoxycarbonyl)benzophenone; a thioxanthone compound such as thioxanthone, 2-chlorothioxanthone, 2-methylthioxanthone, isopropylthioxanthone, 2,4-diisopropylthioxanthone or 2,4-diethylthioxanthone; a triazine compound such as 2,4,6-trichloro-s-triazine, 2-phenyl-4,6-bis (trichloromethyl)-s-triazine, 2-(p-methoxyphenyl)-4,6-bis (trichloromethyl)-s-triazine, 2-(p-tolyl)-4,6-bis (trichloromethyl)-s-triazine, 2-pyperonyl-4,6-bis (trichloromethyl)-s-triazine, 2,4-bis(trichloromethyl)-6-styryl-s-triazine, 2-(naphth-1-yl)-4,6-bis(trichloromethyl)-s-triazine, 2-(4-methoxy-naphth-1-yl)-4,6-bis (trichloromethyl)-s-triazine, 2,4-trichloromethyl-(piperonyl)-6-triazine, or 2,4-trichloromethyl-(4'-methoxystyryl)-6-triazine; an oxime ester compound such as 1,2-octanedione, 1-[4-(phenylthio)-,2-(O-benzoyloxime)], or 0-(acetyl)-N-(1-phenyl-2-oxo-2-(4'-methoxy-naphthyl) ethylidene)hydroxylamine; a phosphine compound such as bis(2,4,6-trimthylbenzoyl)phenylphosphine oxide or 2,4,6-trimethylbenzoyl diphenylphosphine oxide; a quinone compound such as 9,10-phenanthlene quinone, camphor quinone, or ethyl anthraquinone; a borate compound; a carbazole compound; an imidazole compound; a titanocene compound or the like is used. In addition, since the color imaging element is required to be thinner, the pigment concentration in the solid content composition is increased. Therefore, as these photopolymerization initiators, those having high sensitivity such as oxime ester compounds are more preferable.

These photopolymerization initiators can be used alone or in combination of two or more at an arbitrary ratio as necessary.

<Photopolymerizable Monomer (D)>

The photopolymerizable monomer (D) which may be added to the coloring composition of the present invention includes a monomer or oligomer which is cured by ultraviolet light, heat, or the like to form a transparent resin.

Examples of the monomer and oligomer which are cured by ultraviolet light, heat, or the like to form a transparent resin include various acrylates and methacrylates such as methyl (meth)acrylate, ethyl (meth)acrylate, 2-hydroxyethyl (meth) acrylate, 2-hydroxypropyl (meth) acrylate, cyclohexyl (meth) acrylate, β-carboxyethyl (meth) acrylate, polyethyleneglycol di(meth)acrylate, 1,6-hexanediol di(meth) acrylate, triethyleneglycol di(meth)acrylate, tripropyleneglycol di(meth)acrylate, trimethylolpropane tri (meth)acrylate, trimethylolpropane PO-modified tri(meth) acrylate, trimethylolpropane EO-modified tri(meth)acrylate, pentaerythritol tri(meth)acrylate, 1,6-hexanediol diglycidylether di(meth)acrylate, bisphenol A diglycidylether di(meth)acrylate, neopentylglycol diglycidylether di(meth)acrylate, dipentaerythritol hexa(meth)acrylate, dipentaerythritol penta(meth)acrylate, tricyclodecanyl(meth)acrylate, ester acrylate, (meth)acrylate of methylolated melamine, epoxy (meth)acrylate, and urethane acrylate; (meth)acrylic acid, styrene, vinyl acetate, hydroxyethyl vinylether, ethyleneglycol divinylether, pentaerythritol trivinylether, (meth) acrylamide, N-hydroxymethyl(meth)acrylamide, N-vinylformamide, and acrylonitrile, but are not necessarily limited thereto.

The photopolymerizable monomer may also contain an acid group. Examples include esterified products of free hydroxyl group-containing poly(meth)acrylates, which is obtained from polyhydric alcohol and (meth)acrylic acid, and dicarboxylic acids; esterified products of polyvalent carboxylic acid and monohydroxyalkyl (meth)acrylates; and the like. Specific examples include free carboxylic group-containing mono-esterified products of monohydroxyl oligoacrylates or monohydroxyl oligomethacrylates such as trimethylolpropane diacrylate, trimethylolpropane dimethacrylate, pentaerythritol triacrylate, pentaerythritol trimethacrylate, dipentaerythritol pentaacrylate, and dipentaerythritol pentamethacrylate, with dicarboxylic acids such as malonic acid, succinic acid, glutaric acid, and terephthalic acid; free carboxylic group-containing oligo-esterified products of tricarboxylic acids such as propane-1,2,3-tricarboxylic acid (tricarballylic acid), butane-1,2,4-tricarboxylic acid, benzene-1,2,3-tricarboxylic acid, benzene-1,3,4-tricarboxylic acid, and benzene-1,3,5-tricarboxylic acid, with monohydroxyl monoacrylates or monohydroxyl monomethacrylates such as 2-hydroxyethyl acrylate, 2-hydroxyethyl methacrylate, 2-hydroxypropyl acrylate, and 2-hydroxypropyl methacrylate; and the like, but the effect of the present invention is not limited thereto.

The photopolymerizable monomer (D) in the present invention preferably contains a monomer having a polymerizable unsaturated bond group containing urethane acrylate and/or penta- or higher functional acrylate (excluding urethane acrylate). By containing a urethane acrylate, peel-off development can be remarkably improved. It is considered that this is because peel-off development is caused by local curing of a coating film at the time of exposure, meanwhile, by simultaneously containing an ultraviolet absorber, a monofunctional thiol, and urethane acrylate, the termination reaction affected by the ultraviolet absorber, the chain transfer reaction involving the thiol, and the polymerization reaction of urethane acrylate do not proceed locally but proceed uniformly according to the exposure dose. The reason why the above reaction can be made uniform in the coating film is that compatibility between the ultraviolet absorber, the monofunctional thiol, and the urethane acrylate is high. Further, by containing urethane acrylate, the effect of the present invention can be obtained even when the amount of the monofunctional thiol of the present invention added is small. In addition, by containing a penta- or higher functional acrylate, the effect of the present invention can be obtained and development residue can be reduced even when the amount of the monofunctional thiol added is small. It is presumably because crosslink density is improved by using a penta- or higher functional acrylate and a monofunctional thiol, thus, generation of a residue can be suppressed which is caused when a portion of the coating film having a low degree of crosslinking is eroded by a developer to peel off and is attached to the substrate especially in the case of forming a fine pattern with a pixel pattern of 1.0 μm or less. In addition, it is considered that the development residue is reduced because the penta- or higher functional acrylate has high compatibility with both the ultraviolet absorber and the monofunctional thiol. The penta- or higher functional acrylate in the present invention is preferably a hexafunctional acrylate having a remarkable effect.
(Urethane Acrylate)

The urethane acrylate is preferably a compound obtained by reacting a compound represented by the following general formula (1) with a polyfunctional isocyanate represented by the following general formula (2), and in particular, a compound obtained by reacting dipentaerythritol penta(meth)acrylate and isocyanate is preferred.

Since a reaction product of the compound represented by the general formula (1) and the polyfunctional isocyanate represented by the general formula (2), which has an isocyanate group at both ends, cannot be specified or is not realistic at all to be specified directly by its structure or characteristic, it is described by a production method.
General Formula (1):

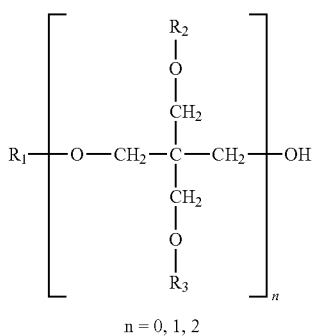

n = 0, 1, 2

In the general formula (1), $R_1$, $R_2$, $R_3$ independently represent an acryloyl group or a methacryloyl group.
General formula (2):

In the general formula (2), X represents a divalent alkylene group or an arylene group.
(Penta- or Higher Functional Acrylate Except Urethane Acrylate)

The penta- or higher functional acrylate of the present invention is (meth)acrylate which does not contain a urethane bond and contains five or more (meth)acryloyl groups in one molecule, and a hexafunctional acrylate is particularly preferable in terms of the residue. Specific examples of the penta- or higher functional acrylates include dipentaerythritol penta(meth)acrylate, dipentaerythritol hexa(meth)acrylate, and caprolactone-modified or alkylene oxide-modified dipentaerythritol hexa(meth)acrylate, acrylate obtained by modifying a hydroxyl group of dipentaerythritol penta(meth)acrylate with succinic acid, and the like.
(Other Monomers)

The urethane acrylate and/or the penta- or higher functional acrylate can be used together with other photopolymerizable monomers or oligomers. Examples include methyl (meth)acrylate, ethyl (meth)acrylate, 2-hydroxyethyl (meth)acrylate, 2-hydroxypropyl (meth)acrylate, cyclohexyl (meth) acrylate, β-carboxyethyl (meth) acrylate, polyethyleneglycol di(meth)acrylate, 1,6-hexanediol di(meth)acrylate, triethyleneglycol di(meth)acrylate, tripropyleneglycol di(meth)acrylate, trimethylolpropane tri(meth)acrylate, pentaerythritol tri(meth)acrylate, and acid anhydride adducts thereof, 1,6-hexanediol diglycidylether di(meth)acrylate, bisphenol A diglycidylether di(meth)acrylate, neopentylglycol diglycidylether di(meth)acrylate, dipentaerythritol penta(meth)acrylate, and acid anhydride adducts thereof, ethylene oxide-modified trimethylolpropane tri(meth)acrylate, propylene oxide-modified trimethylolpropane tri(meth)acrylate, tris(acryloxyethyl) isocyanurate, tris(methacryloxyethyl) isocyanurate, tricyclodecanyl (meth)acrylate, ester acrylate, (meth)acrylate of methylolated melamine, epoxy (meth)acrylate, (meth)acrylic acid, styrene, vinyl acetate, hydroxyethyl vinylether, ethyleneglycol divinylether, pentaerythritol trivinylether, (meth) acrylamide, N-hydroxymethyl(meth)acrylamide, N-vinylformamide, acrylonitrile, and the like.

These photopolymerizable monomers can be used singly or as a mixture of two or more at an arbitrary ratio as necessary.

The content of the photopolymerizable monomer (D) with respect to the total solid content in the photosensitive green composition is preferably 15 to 30% by weight. When the content is less than the above, a tapered portion of the photosensitive coloring composition pattern is stretched long, which makes it difficult to form a high-resolution fine pixel pattern. When the content is more than the above, defects such as deterioration of resolution and residue may occur.

Furthermore, the total content of the urethane acrylate and the penta- or higher functional acrylate contained in the photopolymerizable monomer (D) is preferably 50 to 90% by weight. When the content is less than the above, the tapered portion of the photosensitive coloring composition pattern is stretched long, which makes it difficult to form a high-resolution fine pixel pattern. When the content is more than the above, defects such as deterioration of pattern shape, resolution, and residue may occur.

Here, the solid content represents components other than volatile components such as a solvent.
<Ultraviolet Absorber (E)>

The ultraviolet absorber (E) in the present invention is an organic compound having an ultraviolet absorbing function other than the photopolymerization initiator. The content of the ultraviolet absorber (E) with respect to the total solid content in the photosensitive coloring composition is preferably 0.05 to 3.0% by weight. When the content of the ultraviolet absorber (E) is less than the above, the effect of the ultraviolet absorber is small and the tapered portion of the photosensitive coloring composition pattern is stretched long, which makes it difficult to form a high-resolution fine pixel pattern and increases residue. When the content is more than the above, defects such as generation of insoluble matter and reduction in adhesion may occur.
(Absorbance)

It is preferable that absorbance at a wavelength of 365 nm of the ultraviolet absorber (E) is 0.4 or more.

The absorbance is a measured value when the ultraviolet absorber (E) is dissolved in a solvent having no absorption at a wavelength of 365 nm such as chloroform to be diluted to 10 mg/L, and the measurement method will be described below. This method utilizes relationship between solution concentration and light absorption, which is known as Lambert-Beer's law. That is, when a solution of a certain concentration enclosed in a transparent vessel with a certain thickness is irradiated with light at intensity $I_0$ from one side and light of intensity I coming out of the opposite side is observed, the incident light is absorbed by the solution inside the vessel and its intensity weakens. Moreover, it is known that weakening of the intensity is proportional to the concentration of the solution. A relational expression representing this law with the absorbance as A is represented as $A = -\mathrm{Log}(I_0/I) = abc$.

Here, a is a proportional constant, b is a thickness of the solution, and c is a solution concentration.

The ultraviolet absorber (E) is preferably a benzotriazole-based organic compound, a benzophenone-based organic compound or a triazine-based organic compound, and examples of the benzotriazole-based organic compound having an absorbance at a wavelength of 365 nm of 0.4 or more include 2-(5-methyl-2-hydroxyphenyl) benzotriazole, 2-(3-t-butyl-5-methyl-2-hydroxyphenyl)-5-chlorobenzotriazole, 2,2'-methylenebis[6-(benzotriazol-2-yl)-4-tert-octylphenol], and the like. Examples of the benzophenone-based organic compound include 2,2-di-hydroxy-4,4-dimethoxybenzophenone and the like. Examples of the triazine-based organic compound include 2,4,6-tris(2-hydroxy-4-hexyloxy-3-methylphenyl)-1,3,5-triazine and the like.

Specific examples include "TINUVIN P" (absorbance 0.40), "TINUVIN 326" (absorbance 0.48), and "TINUVIN 360" (absorbance 0.40) manufactured by BASF SE, "Seesorb 107" (absorbance 0.60) manufactured by SHIPRO KASEI KAISHA, LTD., "Adekastab LA-F70" (absorbance 0.90) manufactured by ADEKA CORPORATION, and the like.

<Monofunctional Thiol (F)>

The green composition of the present invention contains a monofunctional thiol compound. As a result, it is possible to provide a photosensitive green composition for a color filter of a solid-state imaging element that can form a rectangular pixel pattern excellent in adhesion.

Since color filters for a solid-state imaging element are required to have a film thickness of 1.0 μm or less, the concentration of coloring components in the photosensitive composition has to be increased. In addition, there has been a tendency that adhesion to the substrate tends to be insufficient because the deep part of the film is not sufficiently irradiated with light compared with the surface part. However, the photosensitive green composition for a color filter of a solid-state imaging element of the present invention can enhance sensitivity and obtain excellent adhesion, by containing a monofunctional thiol.

In the present invention, the monofunctional thiol (F) content in the total solid content of the photosensitive coloring composition is preferably 0.05 to 3.0% by weight. When the content is less than the above, the sensitivity of the photosensitive coloring composition pattern is insufficient, which makes it difficult to form a high-resolution fine pixel pattern. When the content is more than the above, defects such as deterioration of resolution and residue may occur.

The monofunctional thiol (F) in the present invention is preferably a compound represented by the following general formula (3) or general formula (4).

General formula (3)

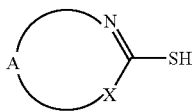

In the general formula (3), X represents a sulfur atom, an oxygen atom, or >N—R, R represents a hydrogen atom, an alkyl group, or an aryl group, and A represents an atomic group forming a heterocycle together with N=C—X.

Examples of the alkyl group represented by R in the general formula (3) can include linear, branched or cyclic alkyl groups having 1 to 20 carbon atoms, and linear alkyl groups having 1 to 12 carbon atoms, branched alkyl groups having 3 to 12 carbon atoms, and cyclic alkyl groups having 5 to 10 carbon atoms are more preferred.

Specific examples include methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group, 2-norbornyl group, and the like.

Examples of the aryl group represented by R in the general formula (3) include those in which one to three benzene rings form a condensed ring and those in which a benzene ring and a 5-membered unsaturated ring form a condensed ring, in addition to those having a single ring structure. Specific examples include phenyl group, naphthyl group, anthryl group, phenanthryl group, indenyl group, acenabutenyl group, and fluorenyl group, and among them, phenyl group and naphthyl group are more preferred.

These alkyl groups and aryl groups may have substituents, and examples of the substituents which can be introduced include linear, branched or cyclic alkyl groups having 1 to 20 carbon atoms, linear, branched or cyclic alkenyl groups having 1 to 20 carbon atoms, alkynyl groups having 2 to 20 carbon atoms, aryl groups having 6 to 20 carbon atoms, acyloxy groups having 1 to 20 carbon atoms, alkoxycarbonyloxy groups having 2 to 20 carbon atoms, aryloxycarbonyloxy groups having 7 to 20 carbon atoms, carbamoyloxy groups having 1 to 20 carbon atoms, carbonamide groups having 1 to 20 carbon atoms, sulfonamide groups having 1 to 20 carbon atoms, carbamoyl groups having 1 to 20 carbon atoms, sulfamoyl groups, substituted sulfamoyl groups having 1 to 20 carbon atoms, alkoxy groups having 1 to 20 carbon atoms, aryloxy groups having 6 to 20 carbon atoms, aryloxycarbonyl groups having 7 to 20 carbon atoms, alkoxycarbonyl groups having 2 to 20 carbon atoms, N-acylsulfamoyl groups having 1 to 20 carbon atoms, N-sulfamoylcarbamoyl groups having 1 to 20 carbon atoms, alkylsulfonyl groups having 1 to 20 carbon atoms, arylsulfonyl groups having 6 to 20 carbon atoms, alkoxycarbonylamino groups having 2 to 20 carbon atoms, aryloxycarbonylamino groups having 7 to 20 carbon atoms, amino group, substituted amino groups having 1 to 20 carbon atoms, imino groups having 1 to 20 carbon atoms, ammonio groups having 3 to 20 carbon atoms, carboxyl group, sulfo group, oxy group, mercapto group, alkylsulfinyl groups having 1 to 20 carbon atoms, arylsulfinyl groups having 6 to 20 carbon atoms, alkylthio groups having 1 to 20 carbon atoms, arylthio groups having 6 to 20 carbon atoms, ureido groups having 1 to 20 carbon atoms, heterocyclic groups having 2 to 20 carbon atoms, acyl groups having 1 to 20 carbon atoms, sulfamoylamino group, substituted sulfamoylamino groups having 1 to 20 carbon atoms, silyl groups having 2 to 20 carbon atoms, isocyanate group, isocyanide group, halogen atom including fluorine atom, chlorine atom, bromine atom, and the like, cyano group, nitro group, onium group, and the like.

Among them, heterocyclic monofunctional thiol compounds such as mercaptoimidazole, mercaptooxazole, mercaptothiazole, mercaptotriazole, mercaptothiadiazole, mercaptobenzoimidazole, mercaptobenzoxazole, mercaptobenzothiazole, and derivatives thereof are preferred, and N-phenylmercaptobenzoimidazole, 2-mercapto-5-methylthio-1,3,4-thiadiazole, 2-mercapto-5-methoxyethylthio-1,3,4-thiadiazole, 5-hexanoxyethoxy-2-mercapto-6-methyl-1,3-benzoxazole, and the like are particularly preferred.

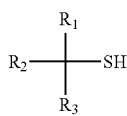

General formula (4)

In the general formula (4), $R_1$ to $R_3$ each independently represent an alkyl group which may have a substituent, an aryl group which may have a substituent, a cycloalkyl group which may have a substituent, a heterocyclic group which may have a substituent, an alkoxyl group which may have a substituent, an aryloxy group which may have a substituent, an alkylthio group which may have a substituent, or an arylthio group which may have a substituent.

Examples of the "alkyl group" of the alkyl group which may have a substituent include linear or branched alkyl group such as methyl group, ethyl group, propyl group, isopropyl group, butyl group, isobutyl group, tert-butyl group, neopentyl group, n-hexyl group, n-octyl group, stearyl group, and 2-ethylhexyl group, and examples of the "alkyl group having a substituent" include trichloromethyl group, trifluoromethyl group, 2,2,2-trifluoroethyl group, 2,2-dibromoethyl group, 2,2,3,3-tetrafluoropropyl group, 2-ethoxyethyl group, 2-butoxyethyl group, 2-nitropropyl group, benzyl group, 4-methylbenzyl group, 4-tert-butylbenzyl group, 4-methoxybenzyl group, 4-nitrobenzyl group, 2,4-dichlorobenzyl group, and the like.

Examples of the "aryl group" of the aryl group which may have a substituent include phenyl group, naphthyl group, anthranyl group, and the like, and examples of the "aryl group having a substituent" include p-methylphenyl group, p-bromophenyl group, p-nitrophenyl group, p-methoxyphenyl group, 2,4-dichlorophenyl group, pentafluorophenyl group, 2-aminophenyl group, 2-methyl-4-chlorophenyl group, 4-hydroxy-1-naphthyl group, 6-methyl-2-naphthyl group, 4,5,8-trichloro-2-naphthyl group, anthraquinonyl group, 2-aminoanthraquinonyl group, and the like.

Examples of the "cycloalkyl group" of the cycloalkyl group which may have a substituent include cyclopentyl group, cyclohexyl group, adamantyl group, and the like, and examples of the "cycloalkyl group having a substituent" include 2,5-dimethylcyclopentyl group, 4-tert-butylcyclohexyl group, and the like.

Examples of the "heterocyclic group" of the heterocyclic group which may have a substituent include pyridyl group, pyrazyl group, piperidino group, pyranyl group, morpholino group, acridinyl group, and the like, and examples of the "heterocyclic group having a substituent" include 3-methylpyridyl group, N-methylpiperidyl group, N-methylpyrrolyl group, and the like.

Examples of the "alkoxyl group" of the alkoxyl group which may have a substituent include linear or branched alkoxyl groups such as methoxy group, ethoxy group, propoxy group, isopropoxy group, n-butoxy group, isobutyloxy group, tert-butyloxy group, neopentyloxy group, 2,3-dimethyl-3-pentyloxy group, n-hexyloxy group, n-octyloxy group, stearyloxy group, and 2-ethylhexyloxy group, and examples of the "alkoxyl group having a substituent" include trichloromethoxy group, trifluoromethoxy group, 2,2,2-trifluoroethoxy group, 2,2,3,3-tetrafluoropropyloxy group, 2,2-ditrifluoromethylpropoxy group, 2-ethoxyethoxy group, 2-butoxyethoxy group, 2-nitropropoxy group, benzyloxy group, and the like.

Examples of the "aryloxy group" of the aryloxy group which may have a substituent include phenoxy group, naphthoxy group, anthryloxy group, and the like, and examples of the "aryloxy group having a substituent" include p-methylphenoxy group, p-nitrophenoxy group, p-methoxyphenoxy group, 2,4-dichlorophenoxy group, pentafluorophenoxy group, 2-methyl-4-chlorophenoxy group, and the like.

Examples of the "alkylthio group" of the alkylthio group which may have a substituent include methylthio group, ethylthio group, propylthio group, butylthio group, pentylthio group, hexylthio group, octylthio group, decylthio group, dodecylthio group, octadecylthio group, and the like, and examples of the "alkylthio group having a substituent" include methoxyethylthio group, aminoethylthio group, benzylaminoethylthio group, methylcarbonylaminoethylthio group, phenylcarbonylaminoethylthio group, and the like.

Examples of the "arylthio group" of the arylthio group which may have a substituent include phenylthio group, 1-naphthylthio group, 2-naphthylthio group, 9-anthrylthio group, and the like, and examples of the "arylthio group having a substituent group" include chlorophenylthio group, trifluoromethylphenylthio group, cyanophenylthio group, nitrophenylthio group, 2-aminophenylthio group, 2-hydroxyphenylthio group, and the like.

Among them, triphenylmethanethiol in which $R_1$ to $R_3$ are all phenyl groups is preferred.

<Organic Solvent>

The coloring composition of the present invention contains an organic solvent in order to make it easy to sufficiently disperse a colorant in a colorant carrier and coat a substrate, for example, a glass substrate with the coloring composition such that the dry film thickness is 0.2 to 5 μm so as to form a filter segment.

The organic solvents can be used singly or as a mixture of two or more. The solvent is preferably used in an amount of 500 to 4,000% by weight based on the total weight (100% by weight) of the colorant since it can adjust the viscosity of the coloring composition to an appropriate value for forming an intended filter segment having a uniform film thickness.

Examples of the organic solvent include ethyl lactate, benzyl alcohol, 1,2,3-trichloropropane, 1,3-butanediol, 1,3-butylene glycol, 1,3-butylene glycol diacetate, 1,4-dioxane, 2-heptanone, 2-methyl-1,3-propanediol, 3,5,5-trimethyl-2-cyclohexen-1-one, 3,3,5-trimethylcyclohexanone, ethyl 3-ethoxypropionate, 3-methyl-1,3-butanediol, 3-methoxy-3-methyl-1-butanol, 3-methoxy-3-methylbutyl acetate, 3-methoxybutanol, 3-methoxybutyl acetate, 4-heptanone, m-xylene, m-diethylbenzene, m-dichlorobenzene, N,N-dimethylacetamide, N,N-dimethylformamide, n-butyl alcohol, n-butyl benzene, n-propyl acetate, o-xylene, o-chlorotoluene, o-diethylbenzene, o-dichlorobenzene, p-chlorotoluene, p-diethylbenzene, sec-butylbenzene, tert-butylbenzene, γ-butyrolactone, isobutyl alcohol, isophorone, ethylene glycol diethyl ether, ethylene glycol dibutyl ether, ethylene glycol monoisopropyl ether, ethylene glycol monoethyl ether, ethylene glycol monoethyl ether acetate, ethylene glycol mono-tertiary butyl ether, ethylene glycol monobutyl ether, ethylene glycol monobutyl ether acetate, ethylene glycol monopropyl ether, ethylene glycol monohexyl ether, ethylene glycol monomethyl ether, ethylene glycol monomethyl ether acetate, diisobutyl ketone, diethylene glycol diethyl ether, diethylene glycol dimethyl ether, diethylene glycol monoisopropyl ether, diethylene glycol monoethyl ether acetate, diethylene glycol monobutyl ether, diethylene glycol monobutyl ether acetate, diethylene glycol monomethyl ether, cyclohexanol, cyclohexanol acetate, cyclohexanone, dipropylene glycol dimethyl ether, dipropylene glycol methyl ether acetate, dipropylene glycol monoethyl ether, dipropylene glycol monobutyl ether, dipropylene glycol monopropyl ether, dipropylene glycol monomethyl ether, diacetone alcohol, triacetin, tripropylene glycol monobutyl ether, tripropylene glycol monomethyl ether, propylene glycol diacetate, propylene glycol phenyl ether, propylene glycol monoethyl ether, propylene glycol monoethyl ether acetate, propylene glycol monobutyl ether, propylene glycol monopropyl ether, propylene glycol monomethyl ether, propylene glycol monomethyl ether acetate, propylene glycol monomethyl ether propionate, benzyl alcohol, methyl isobutyl ketone, methyl cyclohexanol, n-amyl acetate, n-butyl acetate, isoamyl acetate, isobutyl acetate, propyl acetate, dibasic acid ester, and the like.

Among them, it is preferable to use glycol acetates such as ethyl lactate, propylene glycol monomethyl ether acetate, propylene glycol monoethyl ether acetate, ethylene glycol monomethyl ether acetate, ethylene glycol monoethyl ether acetate; aromatic alcohols such as benzyl alcohol; and ketones such as cyclohexanone, because the colorant of the present invention is well dispersed.

<Sensitizer>

The coloring composition of the present invention can further contain a sensitizer. Examples of the sensitizer include unsaturated ketones represented by chalcone derivatives and dibenzalacetone, 1,2-diketone derivatives represented by benzyl and camphorquinone, polymethine dyes such as benzoin derivatives, fluorene derivatives, naphthoquinone derivatives, anthraquinone derivatives, xanthene derivatives, thioxanthane derivatives, xanthone derivatives, thioxanthone derivatives, coumarin derivatives, ketocoumarin derivatives, cyanine derivatives, merocyanine derivatives, and oxonol derivatives; acridine derivatives, azine derivatives, thiazine derivatives, oxazine derivatives, indoline derivatives, azulene derivatives, azulenium derivatives, squarylium derivatives, porphyrin derivatives, tetraphenylporphyrin derivatives, triarylmethane derivatives, tetrabenzoporphyrin derivatives, tetrapyrazinoporphyrazine derivatives, phthalocyanine derivatives, tetraazaporphyrazine derivatives, tetraquinoxalyloporphyrazine derivatives, naphthalocyanine derivatives, subphthalocyanine derivatives, pyrylium derivatives, thiopyrylium derivatives, tetraphyrin derivatives, annulene derivatives, spiropyran derivatives, spirooxazine derivatives, thiospiropyran derivatives, metal arene complexes, organic ruthenium complexes and Michler's ketone derivatives, α-acyloxy ester, acyl phosphine oxide, methylphenyl glyoxylate, benzyl, 9,10-phenanthrenequinone, camphorquinone, ethyl anthraquinone, 4,4'-diethylisophthalophenone, 3,3'- or 4,4'-tetra(t-butylperoxycarbonyl)benzophenone, 4,4'-diethylaminobenzophene, and the like.

More specific examples include sensitizers described in "SHIKISO HANDOBUKKU (Dye Handbook)" (1986, Kodansha Co.), edited by Makoto Ohkawara et al.; "KINOUSEI SIKISO NO KAGAKU (Chemistry of Functional Dyes)" (1981, CMC Co.), edited by Makoto Ohkawara et al.; and "TOKUSHU KINOU ZAIRYO (Special Functional Materials)" (1986, CMC Co.), edited by Chuzaburo Ikemori et al., but they are not limited thereto. In addition, a sensitizer that absorbs light in the ultraviolet to near-infrared range can also be contained.

Two or more types of sensitizers may be used at an arbitrary ratio as necessary. The blending amount when using the sensitizer is preferably 3 to 60% by weight based on the total weight (100% by weight) of the photopolymerization initiator contained in the coloring composition, and is more preferably 5 to 50% by weight from the viewpoint of photocurability and developability.

<Amine Compounds>

The coloring composition of the present invention can further contain an amine compound having a function of reducing dissolved oxygen. Examples of the amine compound include triethanolamine, methyldiethanolamine, triisopropanolamine, methyl 4-dimethylaminobenzoate, ethyl 4-dimethylaminobenzoate, isoamyl 4-dimethylaminobenzoate, ethyl 2-dimethylaminobenzoate, 2-ethylhexyl 4-dimethylaminobenzoate, N,N-dimethyl paratoluidine, and the like.

<Leveling Agent>

It is preferable to add a leveling agent to the coloring composition of the present invention in order to improve leveling properties of the composition on a transparent substrate. As the leveling agent, dimethylsiloxane having a polyether structure or polyester structure in the main chain is preferred. Specific examples of the dimethylsiloxane having a polyether structure in the main chain include FZ-2122 manufactured by Dow Corning Toray Co., Ltd., BYK-333 manufactured by BYK-Chemie GmbH, and the like. Specific examples of the dimethylsiloxane having a polyester structure include BYK-310 and BYK-370 manufactured by BYK-Chemie GmbH, and the like. The dimethylsiloxane having a polyether structure and the dimethylsiloxane having a polyester structure can also be used in combination. In general, the content of the leveling agent is preferably 0.003 to 0.5% by weight based on the total weight (100% by weight) of the coloring composition.

A particularly preferable leveling agent is a type of a so-called surfactant having a hydrophobic group and a hydrophilic group in the molecule, and characterized in that its solubility in water is low despite having a hydrophilic group, and, when it is added to the coloring composition, the surface tension-reducing ability is low, further, those having good wettability with respect to the glass plate despite the low surface tension-reducing ability are useful, and those capable of sufficiently preventing electrification at an added amount at which a defect of the coating film due to foaming does not appear can be preferably used. As the leveling agent having such preferable characteristics, dimethylpolysiloxane having a polyalkylene oxide unit can be preferably used. As the polyalkylene oxide unit, there are a polyethylene oxide unit and a polypropylene oxide unit, and dimethylpolysiloxane may have both a polyethylene oxide unit and a polypropylene oxide unit.

The form of bonding between the polyalkylene oxide units and dimethylpolysiloxane may be any of a pendant type in which the polyalkylene oxide units are bonded to the repeating units of dimethylpolysiloxane, a terminal-modified type in which the polyalkylene oxide units are bonded to the terminals of dimethylpolysiloxane, and a linear block copolymer type in which the polyalkylene oxide units and the polyalkylene oxide units are alternately and repeatedly bonded. Dimethylpolysiloxane having a polyalkylene oxide unit is commercially available from Toray Dow Corning Co., Ltd., and examples of which include FZ-2110, FZ-2122, FZ-2130, FZ-2166, FZ-2191, FZ-2203, and FZ-2207, but it is not limited thereto.

To the leveling agent, an anionic, cationic, nonionic, or amphoteric surfactant can be added supplementarily. The surfactant may be used as a mixture of two or more. Examples of the anionic surfactant supplementarily added to the leveling agent include polyoxyethylene alkyl ether sulfates, sodium dodecylbenzene sulfonate, alkali salts of styrene-acrylic acid copolymer, sodium alkyl naphthalene sulfonate, sodium alkyl diphenyl ether disulfonate, lauryl sulfate monoethanolamine, lauryl sulfate triethanolamine, lauryl sulfate ammonium, stearic acid monoethanolamine, sodium stearate, sodium lauryl sulfate, monoethanolamine of styrene-acrylic acid copolymer, polyoxyethylene alkyl ether phosphate ester, and the like.

Examples of the cationic surfactant supplementarily added to the leveling agent include alkyl quaternary ammonium salts and ethylene oxide adducts thereof. Examples of the nonionic surfactant supplementarily added to the leveling agent include polyoxyethylene oleyl ether, polyoxyethylene lauryl ether, polyoxyethylene nonyl phenyl ether, polyoxyethylene alkyl ether phosphate ester, polyoxyethylene sorbitan monostearate, polyethylene glycol monolaurate, and the like; alkylbetaines such as alkyldimethylaminoacetic acid betaines, amphoteric surfactants such as alkyl imidazolines, and fluorine-based or silicone-based surfactants.

<Curing Agent, Curing Accelerator>

In order to assist curing of a thermosetting resin, the coloring composition of the present invention may further contain a curing agent, a curing accelerator, and the like, as necessary. As the curing agent, phenolic resins, amine compounds, acid anhydrides, active esters, carboxylic acid compounds, sulfonic acid compounds, and the like are effective, but not particularly limited thereto, and any curing agent may be used as long as it can react with a thermosetting resin. Among them, compounds having two or more phenolic hydroxyl groups in one molecule, and amine curing agents are preferably used. As the curing accelerator, amine compounds such as dicyandiamide, benzyldimethylamine, 4-(dimethylamino)-N,N-dimethylbenzylamine, 4-methoxy-N,N-dimethylbenzylamine, 4-methyl-N,N-dimethylbenzylamine, and the like; quaternary ammonium salt compounds such as triethylbenzylammonium chloride, and the like; blocked isocyanate compounds such as dimethylamine, and the like; imidazole derivative bicyclic amidine compounds and salts thereof such as imidazole, 2-methylimidazole, 2-ethylimidazole, 2-ethyl-4-methylimidazole, 2-phenylimidazole, 4-phenylimidazole, 1-cyanoethyl-2-phenylimidazole, 1-(2-cyanoethyl)-2-ethyl-4-methylimidazole, and the like; phosphorus compounds such as triphenylphosphine, and the like; guanamine compounds such as melamine, guanamine, acetoguanamine, benzoguanamine, and the like; and S-triazine derivatives such as 2,4-diamino-6-methacryloyloxyethyl-S-triazine, 2-vinyl-2,4-diamino-S-triazine, 2-vinyl-4,6-diamino-S-triazine/isocyanuric acid adduct, 2,4-diamino-6-methacryloyloxyethyl-S-triazine/isocyanuric acid adduct, and the like can be used. These may be used singly or in combination of two or more. The content of the curing accelerator is preferably 0.01 to 15% by weight based on the total amount of the thermosetting resin.

<Dye Derivative>

Examples of a dye derivative include compounds obtained by introducing a basic substituent, an acid substituent, or a phthalimidomethyl group which may have a substituent, into an organic pigment, anthraquinone, acridone, or triazine. For example, those described in Jpn. Pat. Appln. KOKAI Publication No. 63-305173, Jpn. Pat. Appln. KOKOKU Publication No. 57-15620, Jpn. Pat. Appln. KOKOKU Publication No. 59-40172, Jpn. Pat. Appln. KOKOKU Publication No. 63-17102, Jpn. Pat. Appln. KOKOKU Publication No. 5-9469, Jpn. Pat. Appln. KOKAI Publication No. 2001-335717, Jpn. Pat. Appln. KOKAI Publication No. 2003-128669, Jpn. Pat. Appln. KOKAI Publication No. 2004-091497, Jpn. Pat. Appln. KOKAI Publication No. 2007-156395, Jpn. Pat. Appln. KOKAI Publication No. 2008-094873, Jpn. Pat. Appln. KOKAI Publication No. 2008-094986, Jpn. Pat. Appln. KOKAI Publication No. 2008-095007, Jpn. Pat. Appln. KOKAI Publication No. 2008-195916, Japanese Patent No. 4585781, or the like can be used, and these can be used singly or as a mixture of two or more. When a dye derivative is used, one having a quinophthalone skeleton is preferable from the viewpoint of brightness and dispersibility.

The blending amount of the dye derivative is preferably 0.5% by weight or more, further preferably 1% by weight or more, and most preferably 3% by weight or more, from the viewpoint of improving the dispersibility of the added colorant, based on the total amount (100% by weight) of the added colorant. Further, the blending amount of the dye derivative is preferably 40% by weight or less and further preferably 35% by weight or less, based on the total amount (100% by weight) of the added pigment, from the viewpoint of heat resistance and light resistance.

<Resin-Type Dispersant>

The resin-type dispersant has a colorant affinity segment having a property of being adsorbed by the added colorant, and a segment having compatibility with the colorant carrier, and functions to be adsorbed by the added colorant to stabilize dispersion in the colorant carrier. As the resin-type dispersant, specifically, polyurethanes, polycarboxylic acid esters such as polyacrylates, unsaturated polyamides, polycarboxylic acids, (partial) amine salts of polycarboxylic acids, ammonium salts of polycarboxylic acids, alkyl amine salts of polycarboxylic acids, polysiloxanes, long-chain polyaminoamide phosphates, hydroxyl group-containing polycarboxylic acid esters, and modified products of these compounds, oil-based dispersants such as amides formed by a reaction between a poly(lower alkyleneimine) and a polyester having free carboxyl groups, and salts thereof, (meth)acrylic acid-styrene copolymers, (meth)acrylic acid-(meth)acrylate ester copolymers, styrene-maleic acid copolymers, water-soluble resins and water-soluble polymer compounds such as polyvinyl alcohol and polyvinylpyrrolidone, and polyester, modified polyacrylate, ethylene oxide/propylene oxide adducts, and phosphate ester, and the like are used. These resin-type dispersants can be used singly, or as a mixture of two or more, but they are not necessarily limited thereto.

Among the above dispersants, a polymer dispersant having a basic functional group is preferable because the viscosity of the dispersion becomes low and a high contrast is exhibited by a small added amount, and a nitrogen atom-containing graft copolymer, a nitrogen atom-containing acrylic block copolymer and urethane polymer dispersant and the like having a functional group containing a tertiary amino group, a quaternary ammonium base, a nitrogen-containing heterocyclic ring, or the like in a side chain and the like are preferable.

The resin-type dispersant is preferably used in an amount of about 5 to 200% by weight based on the total amount of the pigment, and more preferably about 10 to 100% by weight from the viewpoint of film formability.

Examples of commercially available resin-type dispersants include Dsperbyk-101, 103, 107, 108, 110, 111, 116, 130, 140, 154, 161, 162, 163, 164, 165, 166, 170, 171, 174, 180, 181, 182, 183, 184, 185, 190, 2000, 2001, 2020, 2025, 2050, 2070, 2095, 2150, and 2155, Anti-Terra-U, 203, and 204, BYK-P104, P104S, 220S, and 6919, Lactimon, Lactimon-WS, Bykumen, and the like manufactured by BYK- Chemie GmbH, SOLSPERSE-3000, 9000, 13000, 13240, 13650, 13940, 16000, 17000, 18000, 20000, 21000, 24000, 26000, 27000, 28000, 31845, 32000, 32500, 32550, 33500, 32600, 34750, 35100, 36600, 38500, 41000, 41090, 53095, 55000, 76500, and the like manufactured by The Lubrizol Corporation, EFKA-46, 47, 48, 452, 4008, 4009, 4010, 4015, 4020, 4047, 4050, 4055, 4060, 4080, 4400, 4401, 4402, 4403, 4406, 4408, 4300, 4310, 4320, 4330, 4330, 4340, 450, 451, 453, 453, 4540, 4550, 4560, 4800, 5010, 5065, 5066, 5070, 7500, 7554, 1101, 120, 150, 1501, 1502, 1503, and the like manufactured by BASF SE, and AJISPER PA111, PB711, PB821, PB822, PB824, and the like manufactured by Ajinomoto Fine-Techno Co., Inc.

<Other Additive Components>

The coloring composition of the present invention can contain a storage stabilizer to stabilize the viscosity over time of the composition. Also, an adhesion improver such as a silane coupling agent can be contained to enhance adhesion to the transparent substrate. Furthermore, a polymerization inhibitor can be contained to prevent sensitization by diffracted light from a mask at the time of exposure.

Examples of the storage stabilizer include quaternary ammonium chlorides such as benzyltrimethyl chloride and diethylhydroxyamine, organic acids such as lactic acid and oxalic acid and methyl esters thereof, organic phosphines such as t-butylpyrocatechol, tetraethylphosphine, and tetraphenylphosphine, phosphites, and the like. The storage stabilizer can be used in amounts of 0.1 to 10% by weight, based on the total amount (100% by weight) of the colorant.

Examples of the adhesion improver include silane coupling agents such as vinylsilanes such as vinyltris(β-methoxyethoxy) silane, vinylethoxysilane, and vinyltrimethoxysilane, (meth)acrylic silanes such as γ-methacryloxypropyltrimethoxysilane, epoxy silanes such as β-(3,4-epoxycyclohexyl)ethyltrimethoxysilane, β-(3,4-epoxycyclohexyl)methyltrimethoxysilane, β-(3,4-epoxycyclohexyl)ethyltriethoxysilane, β-(3,4-epoxycyclohexyl)methyltriethoxysilane, γ-glycidoxypropyltrimethoxysilane, and γ-glycidoxypropyltriethoxysilane, aminosilanes such as N-β(aminoethyl)γ-aminopropyltrimethoxysilane, N-β(aminoethyl)γ-aminopropyltriethoxysilane, N-β(aminoethyl)γ-aminopropylmethyldiethoxysilane, γ-aminopropyltriethoxysilane, γ-aminopropyltrimethoxysilane, N-phenyl-γ-aminopropyltrimethoxysilane, and N-phenyl-γ-aminopropyltriethoxysilane, thiosilanes such as γ-mercaptopropyltrimethoxysilane and γ-mercaptopropyltriethoxysilane. The adhesion improver can be used in an amount of 0.01 to 10% by weight and preferably 0.05 to 5% by weight, based on the total amount (100% by weight) of the colorant in the coloring composition.

Examples of the polymerization inhibitor include alkylcatechol compounds such as catechol, resorcinol, 1,4-hydroquinone, 2-methylcatechol, 3-methylcatechol, 4-methylcatechol, 2-ethylcatechol, 3-ethylcatechol, 4-ethylcatechol, 2-propylcatechol, 3-propylcatechol, 4-propylcatechol, 2-n-butylcatechol, 3-n-butylcatechol, 4-n-butylcatechol, 2-tert-butylcatechol, 3-tert-butylcatechol, 4-tert-butylcatechol, and 3,5-di-tert-butylcatechol; alkylresorcinol such as 2-methylresorcinol, 4-methylresorcinol, 2-ethylresorcinol, 4-ethylresorcinol, 2-propylresorcinol, 4-propylresorcinol, 2-n-butylresorcinol, 4-n-butylresorcinol, 2-tert-butylresorcinol, and 4-tert-butylresorcinol; alkylhydroquinone compounds such as methylhydroquinone, ethylhydroquinone, propylhydroquinone, tert-butylhydroquinone, and 2,5-di-tert-butylhydroquinone, phosphine compounds such as tributylphosphine, trioctylphosphine, tricyclohexylphosphine, triphenylphosphine, and tribenzylphosphine; phosphine oxide compounds such as trioctylphosphine oxide and triphenylphosphine oxide; phosphite compounds such as triphenyl phosphite and trisnonylphenyl phosphite; pyrogallol and phloroglucin, and the like. The content of the polymerization inhibitor is preferably 0.01 to 0.4 parts by weight based on 100 parts by weight of the weight of the coloring composition excluding the solvent.

<Color Filter>

Next, the color filter for a solid-state imaging element of the present invention will be described. The color filter of the present invention includes a green filter segment formed using the green coloring composition for a solid-state imaging element of the present invention. Examples of the color filter include those including a red filter segment and a blue filter segment.

The green coloring composition for a solid-state imaging element of the present invention is mainly used for forming green filter segments, and the filter segments of the other colors can be formed using a red coloring composition and a blue coloring composition which are conventionally used. The coloring composition of each color other than the coloring composition of the present invention can be formed using each coloring composition containing each color pigment, the binder resin, the photopolymerizable composition, and the like.

<Pigment Forming Red Filter Segment>

Examples of a red pigment for the red coloring composition that forms red filter segments include C.I. Pigment Red 7, 14, 41, 48:1, 48:2, 48:3, 48:4, 57:1, 81, 81:1, 81:2, 81:3, 81:4, 122, 146 149, 166, 168, 169, 176, 177, 178, 179, 184, 185, 187, 200, 202, 208, 210, 221, 224, 242, 246, 254, 255, 264, 268, 269, 270, 272, 273, 274, 276, 277, 278, 279, 280, 281, 282, 283, 284, 285, 286, and 287, a diketopyrrolopyrrole pigment described in Jpn. Pat. Appln. KOHYO Publication No. 2011-523433, and a naphthol azo pigment and the like described in Jpn. Pat. Appln. KOKAI Publication No. 2013-161025, and the like, but are not particularly limited thereto.

Further, the red coloring composition can be used in combination with an orange pigment such as C.I. Pigment Orange 43, 71, or 73 and/or a yellow pigment such as C.I. Pigment Yellow 1, 2, 3, 4, 5, 6, 10, 12, 13, 14, 15, 16, 17, 18, 24, 31, 32, 34, 35, 35:1, 36, 36:1, 37, 37:1, 40, 42, 43, 53, 55, 60, 61, 62, 63, 65, 73, 74, 77, 81, 83, 93, 94, 95, 97, 98, 100, 101, 104, 106, 108, 109, 110, 113, 114, 115, 116, 117, 118, 119, 120, 123, 126, 127, 128, 129, 138, 139, 147, 150, 151, 152, 153, 154, 155, 156, 161, 162, 164, 166, 167, 168, 169, 170, 171, 172 173, 174, 175, 176, 177, 179, 180, 181, 182, 185, 187, 188, 193, 194, 198, 199, 213, or 214.

<Pigment Forming Blue Filter Segment>

Examples of a blue pigment for the blue coloring composition that forms a blue filter segments include C.I. Pigment Blue 1, 1:2, 9, 14, 15, 15:1, 15:2, 15:3, 15:4, 15:6, 16, 22, 60, and 64, an aluminum phthalocyanine pigment described in Jpn. Pat. Appln. KOKAI Publication No. 2004-333817, Japanese Patent No. 4893859 and the like, and the like, but are not particularly limited thereto.

Examples of a violet pigment include C.I. Pigment Violet 1, 19, 23, 27, 29, 30, 32, 37, 40, 42, 50, and the like, but are not particularly limited thereto.

<Color Filter for Solid-State Imaging Element>

The color filter segments according to the present invention can be formed using a known method without particular limitation, but since the filter segments of the imaging element are as fine as submicron to about several tens of microns, it is preferable to use photolithography.

An embodiment of the present invention is a method of producing a color filter having a color filter segment formed by curing the coloring composition described above. It contains a color filter segment obtained by curing the coloring composition according to the embodiment of the present invention described above.

The color filter according to the present embodiment includes the green filter segments, red filter segments and blue filter segments described above. Other than the colored filter segments according to the present invention, it may be formed using a known coloring composition containing a color pigment, containing a color dye, or containing both a color pigment and a color dye. Although the method of forming the colored filter segments is not particularly limited, it is general to use a photosensitive coloring composition which is a negative resist.

When forming the color filter segments on predetermined corresponding photoelectric conversion elements, a negative green film constituting a negative color resist layer is formed using a negative photosensitive green composition, and in this case, the thickness of the negative color resist layer is set in the range of 0.1 μm to 3.0 μm.

The surface of the negative color resist layer constituted by the negative colored film is subjected to pattern exposure at the portions corresponding to the photoelectric conversion elements to be formed using a photomask. The photomask has dimensions 4 to 5 times the dimensions of the pattern to be actually formed. Thus, the pattern exposure is performed with the pattern reduced to ¼ to ⅕.

That is, this photomask is a 4 to 5 times reticle, and has a pattern having dimensions of 4 to 5 times the dimensions of the exposure pattern on the surface of the negative color resist layer. Then, using a stepper exposure apparatus (not shown), the pattern of the photomask is reduced to ¼ to ⅕ and the surface of the negative color resist layer is exposed.

By performing an alkali development treatment (development step) following the exposure step, uncured parts after exposure dissolve into the developer and the photo-cured portions remain. By this development step, a patterned coating film comprising color filter segments can be formed.

The developing method may be any of a dip method, a shower method, a spray method, a paddle method, and the like, and these may be combined with a swing method, a spin method, an ultrasonic method, or the like.

It is also possible to prevent uneven development by moistening a surface to be developed with water or the like before contact with the developer. As the developer, an organic alkali developer which does not cause damage to a base circuit or the like is desirable. Generally, the development temperature is 20° C. to 30° C., and the development time is 20 to 90 seconds.

Examples of an alkaline agent contained in the developer include organic alkaline compounds such as aqueous ammonia, ethylamine, diethylamine, dimethylethanolamine, tetramethylammonium hydroxide, tetraethylammonium hydroxide, choline, pyrrole, piperidine, and 1,8-diazabicyclo-[5,4,0]-7-undecene, inorganic compounds such as sodium hydroxide, potassium hydroxide, sodium hydrogencarbonate, and potassium hydrogencarbonate, and the like. As the developer, an alkaline aqueous solution diluted with pure water so that the concentration of these alkaline agents is 0.001% by mass to 10% by mass and preferably 0.01% by mass to 1% by mass is preferably used. When a developer comprising such an alkaline aqueous solution is used, generally, after development, the developer is washed (rinsed) with pure water to wash away excess developer and then dried.

Finally, the filter segments thus formed are hardened.

In the production method of the present invention, after performing the colored layer forming step, the exposure step and the development step described above, a curing step for curing the formed colored pattern by post heating (post baking) or post exposure may be included as necessary. Post-baking is a heat treatment after development to complete the curing, and this heat curing treatment is usually performed at 100° C. to 270° C. When light is used, it can be performed by g-line, h-line, i-line, laser beam emitted by an excimer laser such as KrF or ArF excimer laser, electron beam, X-ray, or the like. It is preferable to perform with an existing high-pressure mercury lamp at a low temperature about 20 to 50° C., and the irradiation time is preferably 10 seconds to 180 seconds, and more preferably 30 seconds to 60 seconds. In the case of combined use of post exposure and post heating, it is preferable to carry out post exposure first.

By repeating the colored layer forming step, the exposure step, and the development step (further, the curing step as necessary) as described above for the desired number of hues, a color filter having desired hues is prepared.

<Solid-State Imaging Element>

The solid-state imaging element of the present invention comprises the color filter of the present invention. The configuration of the solid-state imaging element of the present invention is a configuration provided with the color filter for the solid-state imaging element of the present invention, and is not particularly limited as long as it functions as a solid-state imaging element, and examples of which include the following configurations.

In one of the configurations, photodiodes and transfer electrodes made of polysilicon and the like, which constitute a light-receiving area of a solid-state imaging element (CCD sensor, CMOS sensor, organic CMOS sensor, or the like), are provided on a substrate. A light-shielding film made of tungsten or the like and having openings only at positions of the light-receiving portions of the photodiodes is provided on the photodiodes and the transfer electrodes. A device protective film made of silicon nitride or the like is formed on the light-shielding film to cover the entire light-shielding film and the light-receiving portions of the photodiodes. Further, the color filter for a solid-state imaging element of the present invention is provided on the device protective film.

Alternatively, it may have a configuration further including a light-condensing means (for example, a microlens and the like, the same shall apply hereinafter) above the device protective layer and below the color filter (a side closer to the substrate) or a configuration further including the light-condensing means above the color filter.

The organic CMOS sensor is constituted by including a thin film panchromatic photosensitive organic photoelectric conversion film as a photoelectric conversion layer and a CMOS signal-reading substrate, and has a two-layer hybrid structure in which an organic material plays a role in capturing light and converting it into an electric signal, and an inorganic material plays a role in extracting the electric signal to the outside, and in principle, the aperture ratio can be set to 100% with respect to incident light. The organic photoelectric conversion film is a structure-free continuous film and can be laid on a CMOS signal-reading substrate, so it does not require an expensive microfabrication process and is suitable for filter segment refinement.

Arrangement of the color filter segments is not particularly limited, and known methods can be used.

Hereinafter, the present invention will be specifically described by way of examples. However, the present invention is not limited to the following examples as long as the gist thereof is not deviated. In the examples and comparative examples, "parts" means "parts by weight".

First, prior to the examples, methods for producing resin-type dispersants, binder resin solutions, photopolymerizable monomers, dye derivatives and pigment dispersions used in the examples and comparative examples will be described. Also, the weight average molecular weights (Mw) of the resin-type dispersant and the binder resin are polystyrene-equivalent weight average molecular weights (Mw) measured with a GPC (manufactured by Tosoh Corporation, HLC-8120GPC) equipped with an RI detector, using a TSKgel column (manufactured by Tosoh Corporation) and using THF as a developing solvent. The amine value of the resin-type dispersant was determined by potentiometric titration using a 0.1 N aqueous hydrochloric acid solution, and then converted to the equivalent of potassium hydroxide. The amine value of the resin-type dispersant indicates the amine value of the solid content.

<Production Example of Resin-type Dispersant Solution (G)>

[Resin-Type Dispersant (G-1)]

60 parts of methyl methacrylate, 20 parts of n-butyl methacrylate, and 13.2 parts of tetramethylethylenediamine were added to a reactor equipped with a gas inlet tube, a condenser, stirring blades, and a thermometer, and stirred at 50° C. for 1 hour while flowing nitrogen to replace the inside system with nitrogen. Next, 9.3 parts of ethyl bromoisobutyrate, 5.6 parts of cuprous chloride and 133 parts of PGMAc were added, and the temperature was raised to 110° C. under a nitrogen stream to initiate polymerization of a first block. After polymerization for 4 hours, the polymerization solution was sampled and the solid content was measured, and it was confirmed from conversion of non-volatile matter that the polymerization conversion rate was 98% or more.

Next, 61 parts of PGMAc and 20 parts of dimethylaminoethyl methacrylate (hereinafter referred to as DM) as a second block monomer were added to this reactor, and stirred while maintaining the nitrogen atmosphere at 110° C. to continue the reaction. After 2 hours from the addition of dimethylaminoethyl methacrylate, the polymerization solution was sampled to measure the solid content, and it was confirmed from conversion of non-volatile matter that the polymerization conversion rate of a second block was 98% or more, then the reaction solution was cooled to room temperature to stop the polymerization.

Propylene glycol monomethyl ether acetate was added to the block copolymer solution thus prepared so as to have a non-volatile content of 40% by weight. Thus, obtained was a resin-type dispersant solution (F-1) having an amine value per solid content of 71.4 mg KOH/g, a weight average molecular weight of 9900 (Mw), and a non-volatile content of 40% by weight, in which the non-volatile component has a poly(meth)acrylate skeleton with a tertiary amino group.

[Resin-Type Dispersant (G-2)]

50.0 parts of methyl methacrylate and 50.0 parts of 2-methoxyethyl acrylate were added to a reaction vessel equipped with a gas inlet tube, a thermometer, a condenser, and a stirrer, and the interior was replaced with nitrogen gas. The interior of the reaction vessel was heated to 80° C. to which a solution obtained by dissolving 6.0 parts of 3-mercapto-1,2-propanediol and 0.1 parts of 2,2'-azobisisobutyronitrile in 45.4 parts of propylene glycol monomethyl ether acetate was added, and the mixture was reacted for 10 hours. A solid content was measured to confirm that the reaction was performed to 95%. At this time, the weight average molecular weight was 4,000. Next, 9.7 parts of pyromellitic dianhydride (manufactured by Daicel Chemical Industries, Ltd.), 31.7 parts of PGMAc, and 0.2 parts of 1,8-diazabicyclo-[5.4.0]-7-undecene as a catalyst were added, and the mixture was reacted at 120° C. for 7 hours. An acid value was measured to confirm that the 98% or more of the acid anhydride was half-esterified, and the reaction was terminated. After completion of the reaction, propylene glycol monomethyl ether acetate was added to have a non-volatile content of 60% by weight to thereby obtain a solution of resin-type dispersant (F-2) having an acid value of 43 mg KOH/g and a weight average molecular weight of 9500.

<Binder Resin Solution (B)>

196 parts of cyclohexanone was added to a reaction vessel having a separable 4-neck flask equipped with a thermometer, a cooling tube, a nitrogen gas inlet tube, a dropping tube and a stirrer, and heated to 80° C. After nitrogen substitution inside the reaction vessel, a mixture of 20.0 parts of benzyl methacrylate, 17.2 parts of n-butyl methacrylate, 12.9 parts of 2-hydroxyethyl methacrylate, 12.0 parts of methacrylic acid, 20.7 parts of p-cumylphenol ethylene oxide-modified acrylate ("Aronix M110" manufactured by Toagosei Co., Ltd.), and 1.1 parts of 2,2'-azobisisobutyronitrile was added dropwise over 2 hours from the dropping tube. After the completion of dripping, the reaction was further continued for 3 hours to obtain a solution of an acrylic resin.

After cooling to room temperature, about 2 parts of the resin solution was sampled, and then heated and dried at 180° C. for 20 minutes to measure the non-volatile content. PGMAC was added to the resin solution prepared as above to have a non-volatile content of 40% by weight to thereby prepare a binder resin solution (B). The weight average molecular weight (Mw) was 26,000.

<Production of Photopolymerizable Monomers (D-1, D-2)>

The following photopolymerizable monomers (D-1) and (D-2) were prepared by the same method as described in WO 2010/146801.

Urethane acrylate (D-1): Dipentaerythritol pentaacrylate hexamethylene diisocyanate (reaction product of dipentaerythritol pentaacrylate and hexamethylene diisocyanate)

Urethane acrylate (D-2): Pentaerythritol triacrylate hexamethylene diisocyanate

<Production of Dye Derivative (H-1)>

A dye derivative (H-1) was obtained according to a synthesis method described in Jpn. Pat. Appln. KOKAI Publication No. 2007-156395.

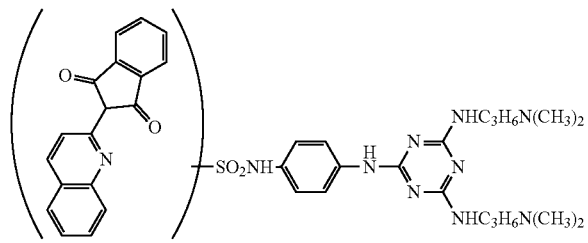

Dye derivative (H-1)

<Production of Dye Derivative (H-2)>

A dye derivative (H-2) was obtained according to the synthesis method described in Jpn. Pat. Appln. KOKAI Publication No. 2007-156395.

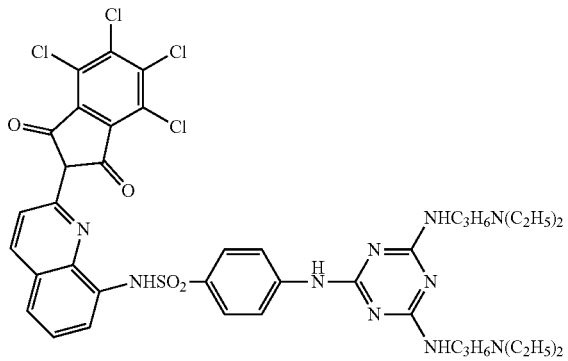

Dye derivative (H-2)

<Production of Dye Derivative (H-3)>

A dye derivative (H-3) was obtained according to the synthesis method described in Jpn. Pat. Appln. KOKAI Publication No. 2007-156395.

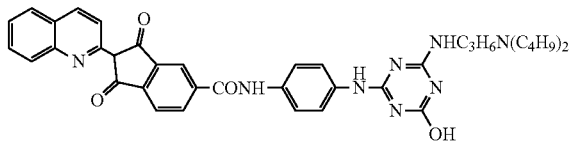

Dye derivative (H-3)

<Preparation of Green Pigment Dispersion 1 (GP-1)>

A mixture of the following components was uniformly stirred and mixed, then dispersed with an Eiger mill for 10 hours using zirconia beads of 0.5 mm in diameter, and then filtered with a 1.0 μm filter to prepare a green pigment dispersion 1 (GP-1).

C.I. Pigment Green 58: 15.0 parts
("FASTOGEN GREEN A110" manufactured by DIC Corporation)
Resin-type dispersant (G-1): 12.5 parts
Propylene glycol monomethyl ether acetate: 72.5 parts <Preparation of Green Pigment Dispersion 2 (GP-2)>

Using a mixture of the following components, a green pigment dispersion 2 (GP-2) was prepared in the same manner as the green pigment dispersion 1 (GP-1).

C.I. Pigment Green 36: 7.50 parts
("LIONOL GREEN 6YK" manufactured by TOYOCOLOR CO., LTD.)
Monoazo pigment (C.I. Pigment Yellow 150): 7.50 parts
("E4GN" manufactured by LANXESS)
Resin-type dispersant (G-1): 12.5 parts
Cyclohexanone: 72.5 parts <Preparation of Yellow Pigment Dispersion 1 (YP-1)>

A mixture of the following components was uniformly stirred and mixed, then dispersed with an Eiger mill for 10 hours using zirconia beads of 0.5 mm in diameter, and then filtered with a 1.0 μm filter to prepare a yellow pigment dispersion 1 (YP-1).

Monoazo pigment (C.I. Pigment Yellow 150): 12.25 parts
Dye derivative (H-1): 1.75 parts
Resin-type dispersant (G-2): 10.00 parts
Propylene glycol monomethyl ether acetate: 76.00 parts <Preparation of Yellow Pigment Dispersion 2 (YP-2)>

A yellow pigment dispersion 2 (YP-2) was prepared in the same manner as the yellow pigment dispersion 1 (YP-1) except that the dye derivative (H-1) in the preparation of yellow pigment dispersion 1 (YP-1) was changed to (H-2).

<Preparation of Yellow Pigment Dispersion 3 (YP-3)>

A yellow pigment dispersion 3 (YP-3) was prepared in the same manner as the yellow pigment dispersion 1 (YP-1) except that the dye derivative (H-1) in the preparation of yellow pigment dispersion 1 (YP-1) was changed to (H-3).

<Production of Green Coloring Composition>

Example 1

The mixture of the following components was stirred and mixed so as to be uniform, and then filtered through a 0.6 μm filter to obtain a green coloring composition 1 (R-1).

Green pigment dispersion 1 (GP-1): 32.7 parts
Yellow pigment dispersion 1 (YP-1): 35.0 parts
Binder resin solution (B): 1.3 parts
Photopolymerization initiator (C-1): 0.4 parts
("IRGACURE OXE 02" manufactured by BASF SE)
Photopolymerizable monomer (D-1): 4.5 parts
Photopolymerizable monomer (D-4): 1.5 parts
("Aronix M-350" manufactured by Toagosei Co., Ltd.)
Ultraviolet absorber (E-1): 0.3 parts
("TINUVIN 326" manufactured by BASF SE)
Monofunctional thiol (F-1): 0.2 parts
(2-Mercapto-5-methylthio-1,3,4-thiadiazole (manufactured by Tokyo Chemical Industry Co., Ltd.))
Propylene glycol monomethyl ether acetate: 24.2 parts (PGMAc)

Examples 2 to 53, Comparative Examples 1 to 2

Examples 2 to 53 and Comparative Examples 1 to 2 were obtained in the same manner as Example 1 except that the compositions were changed to the compositions in Table 1. In addition, the proportion of the solid content of each component in 100 parts by weight of the solid content of the green coloring composition is as shown in Table 2. The units of the numerical values in Tables 1 and 2 are all parts by weight.

TABLE 1

| | Coloring composition (A) | | | | | Binder resin (B) | Photo-polymerization initiator | | Photopolymerizable monomer | | | | | | | Ultraviolet absorber | | | | Monofunctional thiol | | | Solvent | Total |
|---|---|---|---|---|---|---|---|---|---|---|---|---|---|---|---|---|---|---|---|---|---|---|---|---|
| | P.G.58 | P.G.36 | P.Y.150 | | | | | | Urethane acrylate | | | Others | Penta- or higher functional acrylate | | | | | | | | | | | | |
| | GP-1 | GP-2 | YP-1 | YP-2 | YP-3 | | C-1 | C-2 | D-1 | D-2 | D-3 | D-4 | D-5 | D-6 | D-7 | E-1 | E-2 | E-3 | E-4 | F-1 | F-2 | F-3 | | |
| Ex. 1 | 32.7 | | 35.0 | | | 1.3 | 0.4 | | 4.5 | | | 1.5 | | | | 0.3 | | | | 0.2 | | | 24.2 | 100.0 |
| Ex. 2 | 32.7 | | 35.0 | | | 1.3 | 0.4 | | 4.5 | | | 1.5 | | | | 0.3 | | | | 0.2 | | | 24.2 | 100.0 |
| Ex. 3 | 32.7 | | | 35.0 | | 1.3 | 0.4 | | 4.5 | | | 1.5 | | | | 0.3 | | | | 0.2 | | | 24.2 | 100.0 |
| Ex. 4 | 32.7 | | | | 35.0 | 1.3 | 0.4 | | 4.5 | | | 1.5 | | | | 0.3 | | | | 0.2 | | | 24.2 | 100.0 |
| Ex. 5 | 45.7 | | 21.0 | | | 1.7 | 0.4 | | 4.5 | | | 1.5 | | | | 0.3 | | | | 0.2 | | | 24.7 | 100.0 |
| Ex. 6 | | 65.3 | | | | 2.4 | 0.4 | | 4.5 | | | 1.5 | | | | 0.3 | | | | 0.2 | | | 25.4 | 100.0 |
| Ex. 7 | 32.7 | | 35.0 | | | 2.0 | 0.1 | | 4.5 | | | 1.5 | | | | 0.3 | | | | 0.2 | | | 23.8 | 100.0 |
| Ex. 8 | 32.7 | | 35.0 | | | 1.9 | 0.1 | | 4.5 | | | 1.5 | | | | 0.3 | | | | 0.2 | | | 23.8 | 100.0 |
| Ex. 9 | 32.7 | | 35.0 | | | 0.7 | 0.6 | | 4.5 | | | 1.5 | | | | 0.3 | | | | 0.2 | | | 24.6 | 100.0 |
| Ex. 10 | 32.7 | | 35.0 | | | 0.2 | 0.8 | | 4.5 | | | 1.5 | | | | 0.3 | | | | 0.2 | | | 24.9 | 100.0 |
| Ex. 11 | 32.7 | | 35.0 | | | 0.7 | | 0.6 | 4.5 | | | 1.5 | | | | 0.3 | | | | 0.2 | | | 24.6 | 100.0 |
| Ex. 12 | 32.7 | | 35.0 | | | 9.0 | 0.4 | | 1.8 | | | 0.6 | | | | 0.3 | | | | 0.2 | | | 20.1 | 100.0 |
| Ex. 13 | 32.7 | | 35.0 | | | 4.0 | 0.4 | | 3.5 | | | 1.2 | | | | 0.3 | | | | 0.2 | | | 22.8 | 100.0 |
| Ex. 14 | 32.7 | | 35.0 | | | 0.0 | 0.4 | | 4.9 | | | 1.7 | | | | 0.3 | | | | 0.2 | | | 24.9 | 100.0 |
| Ex. 15 | 32.7 | | 35.0 | | | 1.3 | 0.4 | | | | | 5.1 | | | | 0.3 | | | | 0.2 | | | 25.1 | 100.0 |
| Ex. 16 | 32.7 | | 35.0 | | | 1.2 | 0.4 | | 1.9 | | | 3.6 | | | | 0.3 | | | | 0.2 | | | 24.8 | 100.0 |
| Ex. 17 | 32.7 | | 35.0 | | | 1.3 | 0.4 | | 3.8 | | | 2.0 | | | | 0.3 | | | | 0.2 | | | 24.3 | 100.0 |
| Ex. 18 | 32.7 | | 35.0 | | | 1.3 | 0.4 | | 5.1 | | | 1.0 | | | | 0.3 | | | | 0.2 | | | 24.1 | 100.0 |
| Ex. 19 | 32.7 | | 35.0 | | | 1.3 | 0.4 | | 6.4 | | | | | | | 0.3 | | | | 0.2 | | | 23.8 | 100.0 |
| Ex. 20 | 32.7 | | 35.0 | | | 1.3 | 0.4 | | | 5.1 | | 1.5 | | | | 0.3 | | | | 0.2 | | | 23.6 | 100.0 |
| Ex. 21 | 32.7 | | 35.0 | | | 2.0 | 0.4 | | | | 3.6 | 1.5 | | | | 0.3 | | | | 0.2 | | | 25.1 | 100.0 |
| Ex. 22 | 32.7 | | 35.0 | | | 1.9 | 0.4 | | 4.5 | | | 1.5 | | | | 0.3 | | | | 0.2 | | | 23.8 | 100.0 |
| Ex. 23 | 32.7 | | 35.0 | | | 1.9 | 0.4 | | 4.5 | | | 1.5 | | | | 0.3 | | | | 0.2 | | | 23.8 | 100.0 |
| Ex. 24 | 32.7 | | 35.0 | | | 0.8 | 0.4 | | 4.5 | | | 1.5 | | | | 0.3 | | | | 0.2 | | | 24.5 | 100.0 |
| Ex. 25 | 32.7 | | 35.0 | | | 0.0 | 0.4 | | 4.5 | | | 1.5 | | | | 0.3 | | | | 0.2 | | | 25.0 | 100.0 |
| Ex. 26 | 32.7 | | 35.0 | | | 1.3 | 0.4 | | 4.5 | | | 1.5 | | | | 0.01 | | | | 0.2 | | | 24.2 | 100.0 |
| Ex. 27 | 32.7 | | 35.0 | | | 1.3 | 0.4 | | 4.5 | | | 1.5 | | | | 0.04 | | | | 0.2 | | | 24.2 | 100.0 |
| Ex. 28 | 32.7 | | 35.0 | | | 1.3 | 0.4 | | 4.5 | | | 1.5 | | | | 0.5 | | | | 0.2 | | | 24.2 | 100.0 |
| Ex. 29 | 32.7 | | 35.0 | | | 1.7 | 0.4 | | 4.5 | | | 1.5 | | | | 0.8 | | | | 0.01 | | | 23.9 | 100.0 |
| Ex. 30 | 32.7 | | 35.0 | | | 1.7 | 0.4 | | 4.5 | | | 1.5 | | | | | 0.3 | | | 0.04 | | | 24.0 | 100.0 |
| Ex. 31 | 32.7 | | 35.0 | | | 0.5 | 0.4 | | 4.5 | | | 1.5 | | | | | | 0.3 | | 0.5 | | | 24.7 | 100.0 |
| Ex. 32 | 32.7 | | 35.0 | | | 0.0 | 0.4 | | 4.5 | | | 1.5 | | | | | | | 0.3 | 0.7 | | | 25.0 | 100.0 |
| Ex. 33 | 32.7 | | 35.0 | | | 1.3 | 0.4 | | 4.5 | | | 1.5 | | | | 0.3 | | | | | 0.2 | | 24.2 | 100.0 |
| Ex. 34 | 32.7 | | 35.0 | | | 1.3 | 0.4 | | 4.5 | | | 1.5 | | | | 0.3 | | | | | | 0.2 | 24.2 | 100.0 |
| Ex. 35 | 32.7 | | 35.0 | | | 1.3 | 0.4 | | | | | 1.5 | 4.5 | | | 0.3 | | | | 0.2 | | | 24.2 | 100.0 |
| Ex. 36 | 32.7 | | 35.0 | | | 9.0 | 0.4 | | | | | 0.6 | 1.8 | | | 0.3 | | | | 0.2 | | | 20.1 | 100.0 |
| Ex. 37 | 32.7 | | 35.0 | | | 4.0 | 0.4 | | | | | 1.2 | 3.5 | | | 0.3 | | | | 0.2 | | | 22.8 | 100.0 |
| Ex. 38 | 32.7 | | 35.0 | | | 0.0 | 0.4 | | | | | 1.7 | 4.9 | | | 0.3 | | | | 0.2 | | | 24.9 | 100.0 |
| Ex. 39 | 32.7 | | 35.0 | | | 1.2 | 0.4 | | | | | 3.6 | 1.9 | | | 0.3 | | | | 0.2 | | | 24.8 | 100.0 |
| Ex. 40 | 32.7 | | 35.0 | | | 1.3 | 0.4 | | | | | 2.0 | 3.8 | | | 0.3 | | | | 0.2 | | | 24.3 | 100.0 |
| Ex. 41 | 32.7 | | 35.0 | | | 1.3 | 0.4 | | | | | 1.0 | 5.1 | | | 0.3 | | | | 0.2 | | | 24.1 | 100.0 |
| Ex. 42 | 32.7 | | 35.0 | | | 1.3 | 0.4 | | | | | | 6.4 | | | 0.3 | | | | 0.2 | | | 23.8 | 100.0 |
| Ex. 43 | 32.7 | | 35.0 | | | 1.3 | 0.4 | | | | | 1.5 | | 4.5 | | 0.3 | | | | 0.2 | | | 24.2 | 100.0 |

TABLE 1-continued

| | Coloring composition (A) | | | | | Binder resin (B) | Photo- polymerization initiator | | Photopolymerizable monomer | | | | | | | Ultraviolet absorber | | | | Monofunctional thiol | | | Solvent | Total |
|---|---|---|---|---|---|---|---|---|---|---|---|---|---|---|---|---|---|---|---|---|---|---|---|---|
| | P.G.58 | P.G.36 | P.Y.150 | | | | | | Urethane acrylate | | | Others | Penta- or higher functional acrylate | | | | | | | | | | | |
| | GP-1 | GP-2 | YP-1 | YP-2 | YP-3 | | C-1 | C-2 | D-1 | D-2 | D-3 | D-4 | D-5 | D-6 | D-7 | E-1 | E-2 | E-3 | E-4 | F-1 | F-2 | F-3 | | |
| Ex. 44 | 32.7 | | 35.0 | | | 9.0 | 0.4 | | | | | 0.6 | | 1.8 | | 0.3 | | | | 0.2 | | | 20.1 | 100.0 |
| Ex. 45 | 32.7 | | 35.0 | | | 4.0 | 0.4 | | | | | 1.2 | | 3.5 | | 0.3 | | | | 0.2 | | | 22.8 | 100.0 |
| Ex. 46 | 32.7 | | 35.0 | | | 0.0 | 0.4 | | | | | 1.7 | | 4.9 | | 0.3 | | | | 0.2 | | | 24.9 | 100.0 |
| Ex. 47 | 32.7 | | 35.0 | | | 1.2 | 0.4 | | | | | 3.6 | | 1.9 | | 0.3 | | | | 0.2 | | | 24.8 | 100.0 |
| Ex. 48 | 32.7 | | 35.0 | | | 1.3 | 0.4 | | | | | 2.0 | | 3.8 | | 0.3 | | | | 0.2 | | | 24.3 | 100.0 |
| Ex. 49 | 32.7 | | 35.0 | | | 1.3 | 0.4 | | | | | 1.0 | | 5.1 | | 0.3 | | | | 0.2 | | | 24.1 | 100.0 |
| Ex. 50 | 32.7 | | 35.0 | | | 1.3 | 0.4 | | | | | | | 6.4 | | 0.3 | | | | 0.2 | | | 23.8 | 100.0 |
| Ex. 51 | 32.7 | | 35.0 | | | 1.3 | 0.4 | | 2.3 | | | 1.5 | | | 4.5 | 0.3 | | | | 0.2 | | | 24.2 | 100.0 |
| Ex. 52 | 32.7 | | 35.0 | | | 1.3 | 0.4 | | 2.3 | | | 1.5 | 2.3 | | | 0.3 | | | | 0.2 | | | 24.2 | 100.0 |
| Ex. 53 | 32.7 | | 35.0 | | | 1.3 | 0.4 | | 4.5 | | | 1.5 | | 2.3 | | 0.3 | | | | 0.2 | | | 24.2 | 100.0 |
| Comp. ex. 1 | 32.7 | | 35.0 | | | 2.0 | 0.4 | | 4.5 | | | 1.5 | | | | | | | | | | | 23.8 | 100.0 |
| Comp. ex. 2 | 32.7 | | 35.0 | | | 1.8 | 0.4 | | | | | 1.5 | | | | 0.3 | | | | 0.2 | | | 23.9 | 100.0 |

TABLE 2

| | Colorant (A) | | | Pigment derivative | | | Resin-type dispersant | | Binder resin (B) | Photo-polymerization initiator | | Photopolymerizable monomer | | | | |
|---|---|---|---|---|---|---|---|---|---|---|---|---|---|---|---|---|
| | | | | | | | | | | | | Urethane acrylate | | | Others | |
| | P.G.58 | P.G.36 | P.Y.150 | H-1 | H-2 | H-3 | G-1 | G-2 | | C-1 | C-2 | D-1 | D-2 | D-3 | D-4 | |
| Ex. 1 | 24.5 | | 21.4 | 3.1 | | | 8.2 | 10.5 | 2.5 | 1.8 | | 17.9 | | | 7.6 | |
| Ex. 2 | 24.5 | | 21.4 | 3.1 | | | 8.2 | 10.5 | 2.5 | 1.8 | | 17.9 | | | 7.6 | |
| Ex. 3 | 24.5 | | 21.4 | | 3.1 | | 8.2 | 10.5 | 2.5 | 1.8 | | 17.9 | | | 7.6 | |
| Ex. 4 | 24.5 | | 21.4 | | | 3.1 | 8.2 | 10.5 | 2.5 | 1.8 | | 17.9 | | | 7.6 | |
| Ex. 5 | 34.3 | | 12.9 | 1.8 | | | 11.4 | 6.3 | 3.5 | 1.8 | | 17.9 | | | 7.6 | |
| Ex. 6 | | 49.0 | | | | | 16.3 | | 4.9 | 1.8 | | 17.9 | | | 7.6 | |
| Ex. 7 | 24.5 | | 21.4 | 3.1 | | | 8.2 | 10.5 | 4.0 | 0.3 | | 17.9 | | | 7.6 | |
| Ex. 8 | 24.5 | | 21.4 | 3.1 | | | 8.2 | 10.5 | 3.8 | 0.5 | | 17.9 | | | 7.6 | |
| Ex. 9 | 24.5 | | 21.4 | 3.1 | | | 8.2 | 10.5 | 1.3 | 3.0 | | 17.9 | | | 7.6 | |
| Ex. 10 | 24.5 | | 21.4 | 3.1 | | | 8.2 | 10.5 | 0.3 | 4.0 | | 17.9 | | | 7.6 | |
| Ex. 11 | 24.5 | | 21.4 | 3.1 | | | 8.2 | 10.5 | 1.3 | | 3.0 | 17.9 | | | 7.6 | |
| Ex. 12 | 24.5 | | 21.4 | 3.1 | | | 8.2 | 10.5 | 18.0 | 1.8 | | 7.0 | | | 3.0 | |
| Ex. 13 | 24.5 | | 21.4 | 3.1 | | | 8.2 | 10.5 | 8.0 | 1.8 | | 14.0 | | | 6.0 | |
| Ex. 14 | 24.5 | | 21.4 | 3.1 | | | 8.2 | 10.5 | 0.0 | 1.8 | | 19.6 | | | 8.4 | |
| Ex. 15 | 24.5 | | 21.4 | 3.1 | | | 8.2 | 10.5 | 2.5 | 1.8 | | | | | 25.5 | |
| Ex. 16 | 24.5 | | 21.4 | 3.1 | | | 8.2 | 10.5 | 2.4 | 1.8 | | 7.7 | | | 17.9 | |
| Ex. 17 | 24.5 | | 21.4 | 3.1 | | | 8.2 | 10.5 | 2.5 | 1.8 | | 15.3 | | | 10.2 | |
| Ex. 18 | 24.5 | | 21.4 | 3.1 | | | 8.2 | 10.5 | 2.5 | 1.8 | | 20.4 | | | 5.1 | |
| Ex. 19 | 24.5 | | 21.4 | 3.1 | | | 8.2 | 10.5 | 2.5 | 1.8 | | 25.5 | | | | |
| Ex. 20 | 24.5 | | 21.4 | 3.1 | | | 8.2 | 10.5 | 2.5 | 1.8 | | | 17.9 | | 7.6 | |
| Ex. 21 | 24.5 | | 21.4 | 3.1 | | | 8.2 | 10.5 | 2.5 | 1.8 | | | | 17.9 | 7.6 | |
| Ex. 22 | 24.5 | | 21.4 | 3.1 | | | 8.2 | 10.5 | 4.0 | 1.8 | | 17.9 | | | 7.6 | |
| Ex. 23 | 24.5 | | 21.4 | 3.1 | | | 8.2 | 10.5 | 3.8 | 1.8 | | 17.9 | | | 7.6 | |
| Ex. 24 | 24.5 | | 21.4 | 3.1 | | | 8.2 | 10.5 | 1.5 | 1.8 | | 17.9 | | | 7.6 | |
| Ex. 25 | 24.5 | | 21.4 | 3.1 | | | 8.2 | 10.5 | 0.0 | 1.8 | | 17.9 | | | 7.6 | |
| Ex. 26 | 24.5 | | 21.4 | 3.1 | | | 8.2 | 10.5 | 2.5 | 1.8 | | 17.9 | | | 7.6 | |
| Ex. 27 | 24.5 | | 21.4 | 3.1 | | | 8.2 | 10.5 | 2.5 | 1.8 | | 17.9 | | | 7.6 | |
| Ex. 28 | 24.5 | | 21.4 | 3.1 | | | 8.2 | 10.5 | 2.5 | 1.8 | | 17.9 | | | 7.6 | |
| Ex. 29 | 24.5 | | 21.4 | 3.1 | | | 8.2 | 10.5 | 3.5 | 1.8 | | 17.9 | | | 7.6 | |
| Ex. 30 | 24.5 | | 21.4 | 3.1 | | | 8.2 | 10.5 | 3.3 | 1.8 | | 17.9 | | | 7.6 | |
| Ex. 31 | 24.5 | | 21.4 | 3.1 | | | 8.2 | 10.5 | 1.0 | 1.8 | | 17.9 | | | 7.6 | |
| Ex. 32 | 24.5 | | 21.4 | 3.1 | | | 8.2 | 10.5 | 0.0 | 1.8 | | 17.9 | | | 7.6 | |
| Ex. 33 | 24.5 | | 21.4 | 3.1 | | | 8.2 | 10.5 | 2.5 | 1.8 | | 17.9 | | | 7.6 | |
| Ex. 34 | 24.5 | | 21.4 | 3.1 | | | 8.2 | 10.5 | 2.5 | 1.8 | | 17.9 | | | 7.6 | |
| Ex. 35 | 24.5 | | 21.4 | 3.1 | | | 8.2 | 10.5 | 2.5 | 1.8 | | | | | 7.6 | |
| Ex. 36 | 24.5 | | 21.4 | 3.1 | | | 8.2 | 10.5 | 18.0 | 1.8 | | | | | 3.0 | |
| Ex. 37 | 24.5 | | 21.4 | 3.1 | | | 8.2 | 10.5 | 8.0 | 1.8 | | | | | 6.0 | |
| Ex. 38 | 24.5 | | 21.4 | 3.1 | | | 8.2 | 10.5 | 0.0 | 1.8 | | | | | 8.4 | |
| Ex. 39 | 24.5 | | 21.4 | 3.1 | | | 8.2 | 10.5 | 2.4 | 1.8 | | | | | 17.9 | |
| Ex. 40 | 24.5 | | 21.4 | 3.1 | | | 8.2 | 10.5 | 2.5 | 1.8 | | | | | 10.2 | |
| Ex. 41 | 24.5 | | 21.4 | 3.1 | | | 8.2 | 10.5 | 2.5 | 1.8 | | | | | 5.1 | |
| Ex. 42 | 24.5 | | 21.4 | 3.1 | | | 8.2 | 10.5 | 2.5 | 1.8 | | | | | | |
| Ex. 43 | 24.5 | | 21.4 | 3.1 | | | 8.2 | 10.5 | 2.5 | 1.8 | | | | | 7.6 | |
| Ex. 44 | 24.5 | | 21.4 | 3.1 | | | 8.2 | 10.5 | 18.0 | 1.8 | | | | | 3.0 | |
| Ex. 45 | 24.5 | | 21.4 | 3.1 | | | 8.2 | 10.5 | 8.0 | 1.8 | | | | | 6.0 | |
| Ex. 46 | 24.5 | | 21.4 | 3.1 | | | 8.2 | 10.5 | 0.0 | 1.8 | | | | | 8.4 | |
| Ex. 47 | 24.5 | | 21.4 | 3.1 | | | 8.2 | 10.5 | 2.4 | 1.8 | | | | | 17.9 | |
| Ex. 48 | 24.5 | | 21.4 | 3.1 | | | 8.2 | 10.5 | 2.5 | 1.8 | | | | | 10.2 | |
| Ex. 49 | 24.5 | | 21.4 | 3.1 | | | 8.2 | 10.5 | 2.5 | 1.8 | | | | | 5.1 | |
| Ex. 50 | 24.5 | | 21.4 | 3.1 | | | 8.2 | 10.5 | 2.5 | 1.8 | | | | | | |
| Ex. 51 | 24.5 | | 21.4 | 3.1 | | | 8.2 | 10.5 | 2.5 | 1.8 | | | | | 7.6 | |
| Ex. 52 | 24.5 | | 21.4 | 3.1 | | | 8.2 | 10.5 | 2.5 | 1.8 | | 9.0 | | | 7.6 | |
| Ex. 53 | 24.5 | | 21.4 | 3.1 | | | 8.2 | 10.5 | 2.5 | 1.8 | | 9.0 | | | 7.6 | |
| Comp. ex. 1 | 24.5 | | 21.4 | 3.1 | | | 8.2 | 10.5 | 4.0 | 1.8 | | 17.9 | | | 7.6 | |
| Comp. ex. 2 | 24.5 | | 21.4 | 3.1 | | | 8.2 | 10.5 | 3.5 | 1.8 | | 17.9 | | | 7.6 | |

| | Photopolymerizable monomer Penta- or higher functional acrylate | | | Ultraviolet absorber | | | | Monofunctional thiol | | | Total | Content of photo-polymerizable monomer (D) | Content of urethaneacrylate and penta- or higher functional acrylate/D |
|---|---|---|---|---|---|---|---|---|---|---|---|---|---|
| | D-5 | D-6 | D-7 | E-1 | E-2 | E-3 | E-4 | F-1 | F-2 | F-3 | | | |
| Ex. 1 | | | | 1.5 | | | | 1.0 | | | 100.0 | 25.5 | 70% |
| Ex. 2 | | | | 1.5 | | | | 1.0 | | | 100.0 | 25.5 | 70% |
| Ex. 3 | | | | 1.5 | | | | 1.0 | | | 100.0 | 25.5 | 70% |
| Ex. 4 | | | | 1.5 | | | | 1.0 | | | 100.0 | 25.5 | 70% |
| Ex. 5 | | | | 1.5 | | | | 1.0 | | | 100.0 | 25.5 | 70% |
| Ex. 6 | | | | 1.5 | | | | 1.0 | | | 100.0 | 25.5 | 70% |
| Ex. 7 | | | | 1.5 | | | | 1.0 | | | 100.0 | 25.5 | 70% |
| Ex. 8 | | | | 1.5 | | | | 1.0 | | | 100.0 | 25.5 | 70% |

TABLE 2-continued

| | | | | | | | |
|---|---|---|---|---|---|---|---|
| Ex. 9 | | | 1.5 | 1.0 | 100.0 | 25.5 | 70% |
| Ex. 10 | | | 1.5 | 1.0 | 100.0 | 25.5 | 70% |
| Ex. 11 | | | 1.5 | 1.0 | 100.0 | 25.5 | 70% |
| Ex. 12 | | | 1.5 | 1.0 | 100.0 | 10.0 | 70% |
| Ex. 13 | | | 1.5 | 1.0 | 100.0 | 20.0 | 70% |
| Ex. 14 | | | 1.5 | 1.0 | 100.0 | 28.0 | 70% |
| Ex. 15 | | | 1.5 | 1.0 | 100.0 | 25.5 | 0% |
| Ex. 16 | | | 1.5 | 1.0 | 100.0 | 25.6 | 30% |
| Ex. 17 | | | 1.5 | 1.0 | 100.0 | 25.5 | 60% |
| Ex. 18 | | | 1.5 | 1.0 | 100.0 | 25.5 | 80% |
| Ex. 19 | | | 1.5 | 1.0 | 100.0 | 25.5 | 100% |
| Ex. 20 | | | 1.5 | 1.0 | 100.0 | 25.5 | 70% |
| Ex. 21 | | | 1.5 | 1.0 | 100.0 | 25.5 | 70% |
| Ex. 22 | | | 0.05 | 1.0 | 100.0 | 25.5 | 70% |
| Ex. 23 | | | 0.2 | 1.0 | 100.0 | 25.5 | 70% |
| Ex. 24 | | | 2.5 | 1.0 | 100.0 | 25.5 | 70% |
| Ex. 25 | | | 4.0 | 1.0 | 100.0 | 25.5 | 70% |
| Ex. 26 | | | | 1.5 | 1.0 | 100.0 | 25.5 | 70% |
| Ex. 27 | | | | | 1.5 | 1.0 | 100.0 | 25.5 | 70% |
| Ex. 28 | | | | | | 1.5 | 1.0 | 100.0 | 25.5 | 70% |
| Ex. 29 | | | 1.5 | 0.05 | 100.0 | 25.5 | 70% |
| Ex. 30 | | | 1.5 | 0.2 | 100.0 | 25.5 | 70% |
| Ex. 31 | | | 1.5 | 2.5 | 100.0 | 25.5 | 70% |
| Ex. 32 | | | 1.5 | 3.5 | 100.0 | 25.5 | 70% |
| Ex. 33 | | | 1.5 | | 1.0 | 100.0 | 25.5 | 70% |
| Ex. 34 | | | 1.5 | | | 1.0 | 100.0 | 25.5 | 70% |
| Ex. 35 | 17.9 | | 1.5 | 1.0 | 100.0 | 25.5 | 70% |
| Ex. 36 | 7.0 | | 1.5 | 1.0 | 100.0 | 10.0 | 70% |
| Ex. 37 | 14.0 | | 1.5 | 1.0 | 100.0 | 20.0 | 70% |
| Ex. 38 | 19.6 | | 1.5 | 1.0 | 100.0 | 28.0 | 70% |
| Ex. 39 | 7.6 | | 1.5 | 1.0 | 100.0 | 25.5 | 30% |
| Ex. 40 | 15.3 | | 1.5 | 1.0 | 100.0 | 25.5 | 60% |
| Ex. 41 | 20.4 | | 1.5 | 1.0 | 100.0 | 25.5 | 80% |
| Ex. 42 | 25.5 | | 1.5 | 1.0 | 100.0 | 25.5 | 100% |
| Ex. 43 | | 17.9 | 1.5 | 1.0 | 100.0 | 25.5 | 70% |
| Ex. 44 | | 7.0 | 1.5 | 1.0 | 100.0 | 10.0 | 70% |
| Ex. 45 | | 14.0 | 1.5 | 1.0 | 100.0 | 20.0 | 70% |
| Ex. 46 | | 19.6 | 1.5 | 1.0 | 100.0 | 28.0 | 70% |
| Ex. 47 | | 7.6 | 1.5 | 1.0 | 100.0 | 25.5 | 30% |
| Ex. 48 | | 15.3 | 1.5 | 1.0 | 100.0 | 25.5 | 60% |
| Ex. 49 | | 20.4 | 1.5 | 1.0 | 100.0 | 25.5 | 80% |
| Ex. 50 | | 25.5 | 1.5 | 1.0 | 100.0 | 25.5 | 100% |
| Ex. 51 | | | 17.9 | 1.5 | 1.0 | 100.0 | 25.5 | 70% |
| Ex. 52 | 9.0 | | 1.5 | 1.0 | 100.0 | 25.5 | 70% |
| Ex. 53 | | 9.0 | 1.5 | 1.0 | 100.0 | 25.5 | 70% |
| Comp. ex. 1 | | | | 1.0 | 100.0 | 25.5 | 70% |
| Comp. ex. 2 | | | 1.5 | | 100.0 | 25.5 | 70% |

The abbreviations in Tables 1 and 2 are shown below.

<Photopolymerization Initiator (C)>

Photopolymerization initiator C-1: Ethanone, 1-[9-ethyl-6-(2-methylbenzoyl)-9H-carbazol-3-yl]-, 1-(0-acetyloxime) ("IRGACURE OXE 02" manufactured by BASF SE)

Photopolymerization initiator C-2: 2-(Dimethylamino)-2-[(4-methylphenyl)methyl]-1-[4-(4-morpholinyl)phenyl]-1-butanone ("Irgacure 379" manufactured by BASF SE)

<Photopolymerizable Monomer (0)>

Urethane acrylate (D-1): Dipentaerythritol pentaacrylate hexamethylene diisocyanate (reactant of dipentaerythritol pentaacrylate and hexamethylene diisocyanate)

Urethane acrylate (D-2): Pentaerythritol triacrylate hexamethylene diisocyanate

Urethane acrylate (D-3): Polyfunctional urethane acrylate ("KUA-4I" manufactured by KSM CO., LTD.)

Other photopolymerizable monomer (D-4): Trimethylolpropane EO-modified triacrylate ("Aronix M-350" manufactured by Toagosei Co., Ltd.)

A mixture of pentafunctional acrylate and hexafunctional acrylate (D-5) Dipentaerythritol penta- and hexa-acrylate ("Aronix M-402" manufactured by Toagosei Co., Ltd.)

Hexafunctional acrylate (D-6): Dipentaerythritol hexaacrylate ("A-DPH" manufactured by Shin Nakamura Chemical Co., Ltd.)

Hexafunctional acrylate (D-7): Caprolactone modified product of dipentaerythritol hexaacrylate ("DPCA-30" manufactured by Nippon Kayaku Co., Ltd.)

<Ultraviolet Absorber (E)>

Ultraviolet absorber (E-1): (Benzotriazole-based compound) 2-(3-t-butyl-5-methyl-2-hydroxyphenyl)-5-chlorobenzotriazole ("TINUVIN 326" (absorbance 0.5) manufactured by BASF SE)

Ultraviolet absorber (E-2): (Benzophenone-based organic compound) 2,2-di-hydroxy-4,4-dimethoxybenzophenone ("Seesorb 107" (absorbance 0.6) manufactured by SHIPRO KASEI KAISHA, LTD.)

Ultraviolet absorber (E-3): (Triazine-based organic compound) 2,4,6-tris(2-hydroxy-4-hexyloxy-3-methylphenyl)-1,3,5-triazine ("ADEKA STAB LA-F70" (absorbance 0.9) manufactured by ADEKA CORPORATION)

Ultraviolet absorber (E-4): (Cyanoacrylate-based organic compound) 2,2-bis{[(2-cyano-3,3-diphenylacryloyl)oxy]methyl}propan-1,3-diyl=bis(2-cyano-3,3-diphenyl acrylate)

("Uvinul 3050" (absorbance 0.1) manufactured by BASF SE)

<Monofunctional Thiol (F)>
 Monofunctional thiol (F-1): 2-Mercapto-5-methylthio-1,3,4-thiadiazole (manufactured by Tokyo Chemical Industry Co., Ltd.)
 Monofunctional thiol (F-2): Triphenylmethanethiol (manufactured by TOYOBO CO., LTD.)
 Monofunctional thiol (F-3): 4-Aminothiophenol (manufactured by TOYOBO CO., LTD.)

<Evaluation of Photosensitive Coloring Composition>

The resulting photosensitive coloring composition was evaluated by the following method. The results are shown in Table 3.

After forming a pattern on a silicon wafer using the photosensitive green compositions obtained in Examples 1 to 53 and Comparative Examples 1 and 2 described above, the cross-sectional shape, adhesion, and residue were evaluated.

<Pattern Formation>

A 6-inch silicon wafer was coated with resist liquid for planarization film HL-18s (manufactured by Nippon Steel Chemical Co., Ltd.) by spin coating, and a heat treatment with a hot plate was performed at 100° C. for 6 minutes as pre-baking. Furthermore, the coated film was cured by treatment in an oven at 230° C. for 1 hour to form a planarization film of 0.5 μm.

The silicon wafer with the planarization film was coated with the photosensitive composition obtained above by a spin coater, and a heat treatment on a hot plate was performed at 100° C. for 1 minute as pre-baking.

Next, using an i-line stepper FPA-5510iZ (manufactured by Canon Inc.), exposure was performed with a focal length of −0.3 μm through a mask of a 1.1 μm square pixel pattern. Exposure was performed while increasing the exposure dose from 1,000 J by 1,000 J. The coating film after exposure was developed for 1 minute with an organic alkali developer OD210 (manufactured by ADEKA CORPORATION), and paddle-washed with water for 1 minute, and the substrate was dried by spin drying. After development and washing with water, a green pattern was obtained.

The obtained green pattern was heat treated for 4 minutes on a hot plate at 230° C. to complete the formation of the green pattern.

<Cross-Sectional Shape Evaluation>

The shape of the formed pixel pattern was observed using SEM (scanning electron microscope) eCD2-XP (manufactured by KLA Corporation) and evaluated. The evaluation was performed based on the ratio of the line width (T) at the upper base of the formed pattern portion to the line width (S) at the middle portion between the upper base and the lower base, T/S value, with reference to the following.
 0.75 or more: ø (good)
 0.65 or more and less than 0.75: Δ (practical)
 Less than 0.65: x (not practical)

<Adhesion>

Exposure of a pattern with a focal length of −0.3 μm was performed through a mask having mask dimensions for a square pixel pattern of 0.8, 1.0, 1.2, 1.4, 1.6, 1.8 μm square, and resolution of the formed pattern was evaluated.
 Resolution of 0.8 μm to less than 1.4 μm: ø (good)
 Resolution of 1.4 μm or more and 1.8 μm or less: Δ (practical)
 For other resolutions or peeling: x (not practical)

<Residue 1>

The coating film was exposed to 5,000 J ultraviolet light using the stepper with the mask dimensions for forming a pixel pattern of 1.2 μm square. Then, developing, water washing and drying steps were performed. Thereafter, the substrate was observed. The portion of the substrate on which the pattern was not formed was observed with SEM (scanning electron microscope) and evaluated.
 No residue on substrate: ø (good)
 Residue on substrate, but practical: Δ (practical)
 Residue on substrate: x (not practical).

<Residue 2>

The coating film was exposed to 5,000 J ultraviolet light using the stepper with the mask dimensions for forming a pixel pattern of 1.0 μm square. Then, developing, water washing and drying steps were performed. Thereafter, the substrate was observed. The portion of the substrate on which the pattern was not formed was observed with SEM (scanning electron microscope) and evaluated.
 No residue on substrate: ø (good)
 Residue on substrate, but practical: Δ (practical)
 Residue on substrate: x (not practical).

<Peeling Developability>

A 6-inch silicon wafer was coated with a resist liquid for planarization film HL-18s (manufactured by Nippon Steel Chemical Co., Ltd.) by spin coating, and heat treatment with a hot plate was performed at 100° C. for 6 minutes as pre-baking. Furthermore, the coated film was cured by treatment in an oven at 230° C. for 1 hour to form a planarization film of 0.5 μm. Subsequently, the silicon wafers with the planarization film was coated with the photosensitive compositions of Examples and Comparative Examples by a spin coater, and heat treatment on a hot plate was performed at 100° C. for 1 minute as pre-baking. The developability was evaluated by immersing these substrates in a developer and measuring the time until the coating film was peeled off or dissolved.

In the case where the coating film was completely dissolved within 30 seconds, it was evaluated as "☉ (excellent)".

In the case where the coating film was completely dissolved within 30 to 60 seconds, it was evaluated as "ø (good)".

In the case where the coating film was peeled off with the developer, and the peeled piece was dissolved within 60 seconds, it was evaluated as "Δ (practical)".

In the case where the coating film was peeled off with the developer, and the peeled piece was not dissolved within 60 seconds, it was evaluated as "x (not practical)".

TABLE 3

| | Evaluation results | | | | |
|---|---|---|---|---|---|
| | Cross-sectional shape | Adhesion | Residue 1 | Residue 2 | Peel-off developability |
| Ex. 1 | ○ | ○ | ○ | Δ | ☉ |
| Ex. 2 | ○ | ○ | ○ | Δ | ☉ |
| Ex. 3 | ○ | ○ | ○ | Δ | ☉ |
| Ex. 4 | ○ | ○ | ○ | Δ | ☉ |
| Ex. 5 | ○ | ○ | ○ | Δ | ☉ |
| Ex. 6 | ○ | ○ | ○ | Δ | ☉ |
| Ex. 7 | ○ | Δ | ○ | Δ | ☉ |
| Ex. 8 | ○ | ○ | ○ | Δ | ☉ |
| Ex. 9 | ○ | ○ | ○ | Δ | ☉ |
| Ex. 10 | ○ | ○ | Δ | Δ | ☉ |
| Ex. 11 | ○ | ○ | ○ | Δ | ☉ |
| Ex. 12 | Δ | Δ | ○ | Δ | ○ |
| Ex. 13 | ○ | ○ | ○ | Δ | ☉ |
| Ex. 14 | ○ | ○ | ○ | Δ | ☉ |
| Ex. 15 | Δ | ○ | ○ | Δ | Δ |

TABLE 3-continued

| | Evaluation results | | | | |
|---|---|---|---|---|---|
| | Cross-sectional shape | Adhesion | Residue 1 | Residue 2 | Peel-off developability |
| Ex. 16 | ○ | ○ | ○ | Δ | ○ |
| Ex. 17 | ○ | ○ | ○ | Δ | ◎ |
| Ex. 18 | ○ | ○ | ○ | Δ | ◎ |
| Ex. 19 | ○ | ○ | Δ | Δ | ◎ |
| Ex. 20 | ○ | ○ | ○ | Δ | ◎ |
| Ex. 21 | Δ | ○ | ○ | Δ | Δ |
| Ex. 22 | Δ | ○ | Δ | Δ | ◎ |
| Ex. 23 | ○ | ○ | ○ | Δ | ◎ |
| Ex. 24 | ○ | ○ | ○ | Δ | ◎ |
| Ex. 25 | Δ | ○ | ○ | Δ | ◎ |
| Ex. 26 | ○ | ○ | ○ | Δ | ◎ |
| Ex. 27 | ○ | ○ | ○ | Δ | ◎ |
| Ex. 28 | Δ | ○ | Δ | Δ | ◎ |
| Ex. 29 | Δ | Δ | ○ | Δ | ◎ |
| Ex. 30 | ○ | ○ | ○ | Δ | ◎ |
| Ex. 31 | ○ | ○ | ○ | Δ | ◎ |
| Ex. 32 | ○ | ○ | Δ | Δ | ◎ |
| Ex. 33 | ○ | ○ | ○ | Δ | ◎ |
| Ex. 34 | Δ | ○ | ○ | Δ | ◎ |
| Ex. 35 | ○ | Δ | ○ | Δ | ◎ |
| Ex. 36 | Δ | Δ | ○ | Δ | ○ |
| Ex. 37 | ○ | Δ | ○ | Δ | ◎ |
| Ex. 38 | ○ | Δ | ○ | Δ | ◎ |
| Ex. 39 | ○ | Δ | ○ | Δ | ○ |
| Ex. 40 | ○ | Δ | ○ | Δ | ◎ |
| Ex. 41 | ○ | Δ | ○ | Δ | ◎ |
| Ex. 42 | Δ | Δ | ○ | Δ | ◎ |
| Ex. 43 | ○ | Δ | ○ | ○ | ◎ |
| Ex. 44 | Δ | Δ | ○ | ○ | ○ |
| Ex. 45 | ○ | Δ | ○ | ○ | ◎ |
| Ex. 46 | ○ | Δ | ○ | ○ | ◎ |
| Ex. 47 | ○ | Δ | ○ | ○ | ○ |
| Ex. 48 | ○ | Δ | ○ | ○ | ◎ |
| Ex. 49 | ○ | Δ | ○ | ○ | ◎ |
| Ex. 50 | Δ | Δ | ○ | ○ | ◎ |
| Ex. 51 | ○ | Δ | ○ | ○ | ◎ |
| Ex. 52 | ○ | Δ | ○ | Δ | ◎ |
| Ex. 53 | ○ | Δ | ○ | ○ | ◎ |
| Comp. ex. 1 | Δ | ○ | X | X | X |
| Comp. ex. 2 | X | Δ | ○ | Δ | X |

As shown in Table 3, all of the filter segments formed using the photosensitive coloring compositions of Examples 1 to 53 obtained practically satisfactory results regarding the cross-sectional shape, adhesion, residue, and peeling developability. Furthermore, in Examples 43, 45, 46, 48 to 51, 53 containing a hexafunctional acrylate, the residue was good even with a finer pattern.

When the ultraviolet absorber (E) is not contained as in Comparative Example 1, a residue is generated in the pattern, and when the monofunctional thiol (F) is not contained as in Comparative Example 2, the cross-sectional shape becomes defective, and one in which all would be good was not obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A photosensitive green composition for a color filter of a solid-state imaging element, comprising:
    a colorant (A);
    a binder resin (B);
    a photopolymerization initiator (C);
    a photopolymerizable monomer (D);
    an ultraviolet absorber (E); and
    a monofunctional thiol (F),
    wherein the colorant (A) comprises C.I. Pigment Green 36, C.I. Pigment Green 58, and/or C.I. Pigment Yellow 150, and
    the monofunctional thiol (F) comprises 2-mercapto-5-methylthio-1,3,4-thiadiazole or triphenylmethanethiol, and
    a content of the monofunctional thiol (F) is 0.05 to 3.00% by weight in a total solid content of the photosensitive green composition.

2. The photosensitive green composition for a color filter of a solid-state imaging element according to claim 1, wherein the photopolymerizable monomer (D) comprises a urethane acrylate, and the urethane acrylate is a compound obtained by reacting a compound represented by a general formula (1) with a polyfunctional isocyanate represented by a general formula (2),
    the general formula (1) being

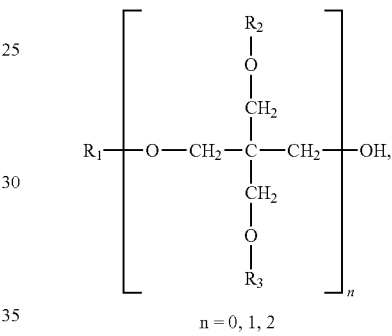

$n = 0, 1, 2$ wherein $R_1$, $R_2$, $R_3$ independently represent an acryloyl group or a methacryloyl group, and
    the general formula (2) being

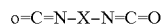

wherein X represents a divalent alkylene group or an arylene group.

3. The photosensitive green composition for a color filter of a solid-state imaging element according to claim 1, wherein a content of the ultraviolet absorber (E) is 0.05 to 3.00% by weight in a total solid content of the photosensitive green coloring composition.

4. The photosensitive green composition for a color filter of a solid-state imaging element according to claim 1, wherein the ultraviolet absorber (E) comprises an ultraviolet absorber having an absorbance at a wavelength of 365 nm of 0.4 or more measured when dissolved in chloroform to be diluted to 10 mg/L.

5. The photosensitive green composition for a color filter of a solid-state imaging element according to claim 1, wherein the ultraviolet absorber (E) comprises at least one selected from benzotriazole-based compounds, benzophenone-based compounds, and triazine-based compounds.

6. The photosensitive green composition for a color filter of a solid-state imaging element according to claim 1, wherein a content of the colorant (A) is 40 to 70% by weight in a total solid content of the photosensitive green composition.

7. The photosensitive green composition for a color filter of a solid-state imaging element according to claim 1, wherein a content of the photopolymerization initiator (C) is 0.3 to 5.0% by weight in a total solid content of the photosensitive green composition.

8. The photosensitive green composition for a color filter of a solid-state imaging element according to claim 1, wherein the photopolymerization initiator (C) comprises an oxime ester-based photopolymerization initiator.

9. A color filter for a solid-state imaging element, comprising a filter segment made from the photosensitive green composition for a color filter of a solid-state imaging element as defined in claim 1 on a base material.

10. A solid-state imaging element comprising the color filter for a solid-state imaging element as defined in claim 9.

11. The photosensitive green composition for a color filter of a solid-state imaging element according to claim 1, wherein the photopolymerizable monomer (D) comprises urethane acrylate and/or penta- or higher functional acrylate excluding urethane acrylate.

12. The photosensitive green composition for a color filter of a solid-state imaging element according to claim 11, wherein a content of the photopolymerizable monomer (D) is 15 to 30% by weight with respect to a total solid content of the photosensitive green coloring composition, and a total content of the urethane acrylate and the penta- or higher functional acrylate excluding urethane acrylate is 50 to 90% by weight in a total solid content of the photopolymerizable monomer (D).

* * * * *